US012787283B2

(12) United States Patent
Hashimoto et al.

(10) Patent No.: US 12,787,283 B2

(45) Date of Patent: Nov. 3, 2026

(54) SEMICONDUCTOR MEMORY DEVICE AND MANUFACTURING METHOD OF SEMICONDUCTOR MEMORY DEVICE

(71) Applicant: Kioxia Corporation, Tokyo (JP)

(72) Inventors: Junichi Hashimoto, Yokkaichi Mie (JP); Toshiyuki Sasaki, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 466 days.

(21) Appl. No.: 18/458,069

(22) Filed: Aug. 29, 2023

(65) Prior Publication Data

US 2024/0098999 A1 Mar. 21, 2024

(30) Foreign Application Priority Data

Sep. 20, 2022 (JP) ................................ 2022-149409

(51) Int. Cl.

| | |
|---|---|
| ***H10B 43/27*** | (2023.01) |
| ***H10B 43/10*** | (2023.01) |
| ***H10B 43/50*** | (2023.01) |
| ***H10B 80/00*** | (2026.01) |
| ***H10D 64/01*** | (2025.01) |
| ***H10W 90/00*** | (2026.01) |
| *H10W 80/00* | (2026.01) |

(52) U.S. Cl.

CPC ............. *H10B 43/27* (2023.02); *H10B 80/00* (2023.02); *H10W 90/00* (2026.01); *H10W 80/312* (2026.01); *H10W 80/327* (2026.01); *H10W 90/792* (2026.01)

(58) Field of Classification Search

CPC ........ H10B 43/27; H10B 80/00; H10B 43/50; H10B 43/10; H10B 41/27; H10W 90/00; H10W 80/312; H10W 80/327; H10W 90/792; H10W 80/00; H10W 20/42; H10D 64/037

See application file for complete search history.

(56) References Cited

U.S. PATENT DOCUMENTS

| | | | |
|---|---|---|---|
| 9,917,097 | B2 | 3/2018 | Horiguchi |
| 2015/0263036 | A1 | 9/2015 | Yasuda |
| 2017/0200732 | A1 | 7/2017 | Horiguchi |

(Continued)

FOREIGN PATENT DOCUMENTS

| | | | |
|---|---|---|---|
| CN | 106910746 | A | 6/2017 |
| JP | 2015177013 | A | 10/2015 |

OTHER PUBLICATIONS

Japanese Office Action dated Dec. 23, 2025, mailed in counterpart Japanese Application No. 2022-149409, 8 pages.

*Primary Examiner* — Sonya McCall-Shepard

(74) *Attorney, Agent, or Firm* — Kim & Stewart LLP

(57) ABSTRACT

According to one embodiment, a semiconductor memory device includes a lower layer, a stacked body above the lower layer with first conductive layers and first insulating layers alternately stacked. A pillar penetrates through the stacked body to reach the lower layer. At least one first insulating layer other than the lowest among the first insulating layers in a first region of the stacked body is thicker than first insulating layers in a second region above the first region. The pillar has a first bowing shape at the height of the at least one thicker first insulating layer and a second bowing shape at a height in the second region.

15 Claims, 19 Drawing Sheets

(56) References Cited

U.S. PATENT DOCUMENTS

| | | | | |
|---|---|---|---|---|
| 2019/0057974 | A1 | 2/2019 | Lu | |
| 2021/0040607 | A1 | 2/2021 | Han | |
| 2021/0320004 | A1 | 10/2021 | Subramonium | |
| 2021/0375905 | A1 * | 12/2021 | Hwang | H10B 43/40 |

* cited by examiner

SEMICONDUCTOR MEMORY DEVICE AND MANUFACTURING METHOD OF SEMICONDUCTOR MEMORY DEVICE

CROSS-REFERENCE TO RELATED APPLICATION

This application is based upon and claims the benefit of priority from Japanese Patent Application No. 2022-149409, filed Sep. 20, 2022, the entire contents of which are incorporated herein by reference.

FIELD

Embodiments described herein relate generally to a semiconductor memory device and a manufacturing method of a semiconductor memory device.

BACKGROUND

In a manufacturing process of a semiconductor memory device, such as a three-dimensional non-volatile memory, a memory hole penetrating through a stacked body having a plurality of insulating layers of different types is formed. In recent years, the number of stacked insulating layers has been increasing, and it is required to form a memory hole with a wide bottom diameter under conditions of a high etching rate.

DETAILED DESCRIPTION

Embodiments provide a semiconductor memory device and a manufacturing method of a semiconductor memory device in which a memory hole with a wide bottom diameter can be formed under conditions of a high etching rate.

In general, according to one embodiment, a semiconductor memory device includes a lower layer film, a first stacked body disposed above the lower layer film and having a plurality of first conductive layers and a plurality of first insulating layers alternately stacked on each other one-by-one in a stacking direction. A first pillar penetrates through the first stacked body to reach the lower layer film. A memory cell is formed at each intersection of the first pillar with the first conductive layers. At least one first insulating layer among the plurality of first insulating layers in a first region other than a lowermost first insulating layer of the first stacked body is thicker than the first insulating layers located in a second region above the first region. The first pillar has a first bowing shape at a height position of the at least one first insulating layer and a second bowing shape at height position of the second region.

Hereinafter, certain example embodiments will be described with reference to the accompanying drawings. It should be noted that the present disclosure is not limited by these particular example embodiments.

Embodiment 1

Embodiment 1 will be described below with reference to the drawings.

(Configuration Example of Semiconductor Memory Device)

Figure 1A:
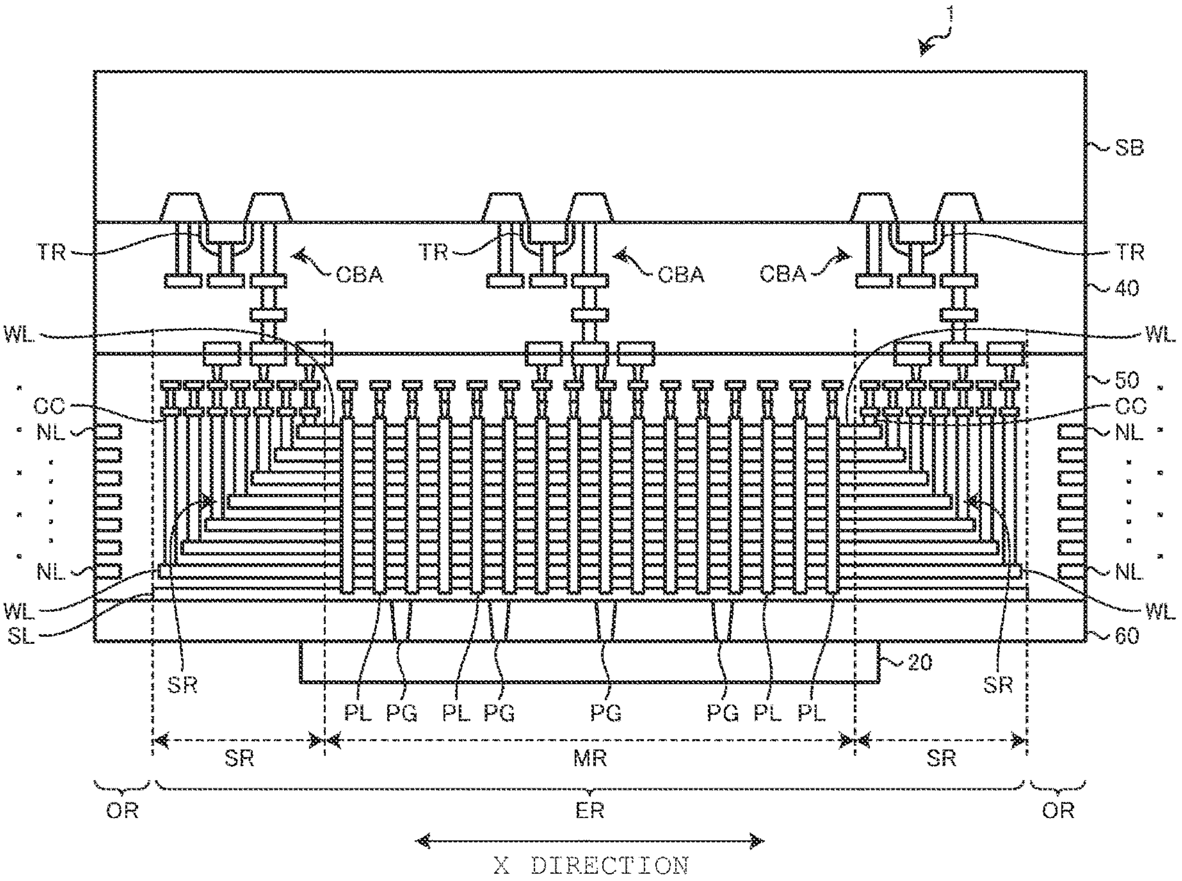
FIGS. 1A and 1B are diagrams of a semiconductor memory device according to Embodiment 1.
Figure 1B:
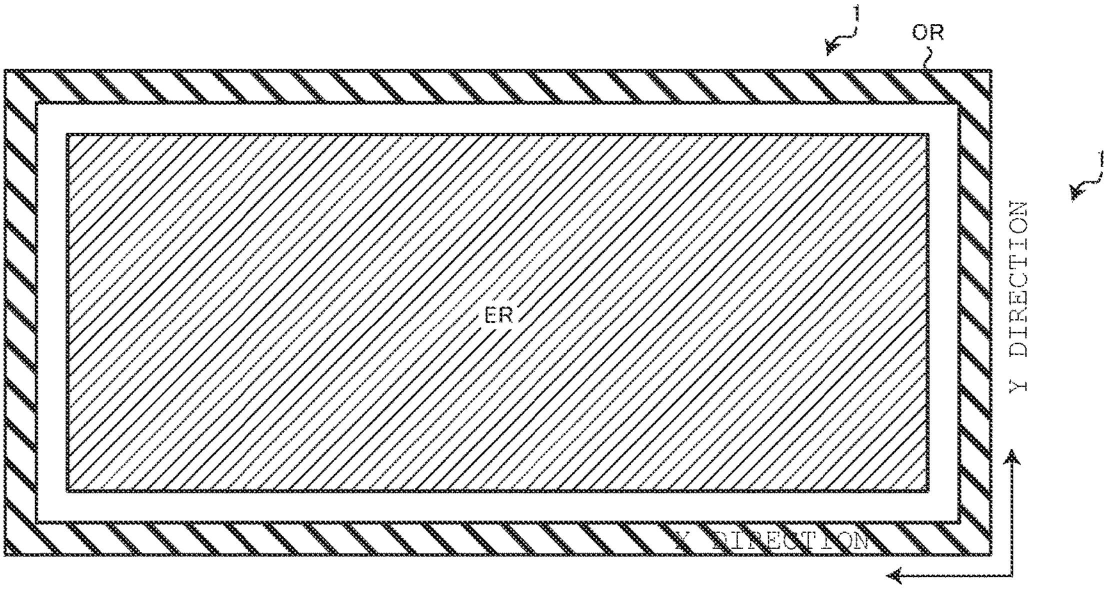

FIGS. 1A and 1B are diagrams showing a schematic configuration example of a semiconductor memory device 1 according to Embodiment 1. FIG. 1A is a cross-sectional view of the semiconductor memory device 1 along an X direction, and FIG. 1B is a schematic plan view of the semiconductor memory device 1. In FIG. 1A, hatching is omitted in consideration of the visibility of the drawing.

In the present specification, both the X direction and the Y direction are directions along the planes of word lines WL. The X direction and the Y direction are orthogonal to each other.

As shown in FIGS. 1A and 1B, the semiconductor memory device 1 is configured in a substantially rectangular chip shape. The semiconductor memory device 1 includes an electrode film 20, a source line SL, and a plurality of word lines WL in order from the bottom of the drawing. The semiconductor memory device 1 further includes a peripheral circuit CBA provided on the semiconductor substrate SB above the plurality of word lines WL. In the description of the semiconductor memory device 1, the side on which the semiconductor substrate SB is disposed is called the upper side of the semiconductor memory device 1.

The source line SL is disposed on the electrode film 20 with an insulating layer 60 interposed therebetween. A plurality of plugs PG are disposed in the insulating layer 60, and electrical continuity is maintained between the source line SL and the electrode film 20 via the plugs PG. Thereby, a source voltage can be applied to the source line SL from the outside of the semiconductor memory device 1 through the electrode film 20 and the plug PG.

A plurality of word lines WL are stacked on the source line SL. In the semiconductor memory device 1, a region in which a plurality of word lines WL are disposed corresponds to an element region ER. A memory region MR is disposed in the central portion of a plurality of word lines WL, and staircase regions SR are disposed at respective ends in the X direction.

A plurality of pillars PL penetrating through the word lines WL in the stacking direction are disposed in the memory region MR. A plurality of memory cells are formed at intersections between the pillars PL and the word lines WL. Thereby, the semiconductor memory device 1 is configured as a three-dimensional non-volatile memory in which memory cells are three-dimensionally disposed in the memory region MR, for example.

In the staircase region SR, a plurality of word lines WL are processed stepwise and terminated. A contact CC connected to the word line WL of each layer is disposed on the terrace portion of each of stages formed by the plurality of word lines WL.

By these contacts CC, the word lines WL stacked in multiple layers are individually drawn out. From these contacts CC, a write voltage, a read voltage, and the like are applied to the memory cells provided in the memory region MR in the central portion of the plurality of word lines WL via the word lines WL at the same height positions as the memory cells.

The plurality of word lines WL, pillars PL, and contacts CC are covered with an insulating layer 50. The insulating layer 50 also extends around the plurality of word lines WL. Respective ends in the X direction and respective ends in the Y direction of the insulating layer 50 correspond to the end faces of the semiconductor memory device 1.

In the vicinity of the end face of the semiconductor memory device 1, an outer peripheral region OR is disposed along the end face of the semiconductor memory device 1. That is, the outer peripheral region OR surrounds the element region ER at a predetermined distance from the element region ER. A plurality of insulating layers NL are stacked in the outer peripheral region OR so as to correspond to the height positions of the plurality of word lines WL.

The chip-shaped semiconductor memory device 1 is obtained, for example, by singulation of the substrate that supports the semiconductor memory device 1. A plurality of semiconductor memory devices 1 are disposed, for example, in a matrix on the substrate before singulation, and scribe lines for cutting out of the semiconductor memory devices 1 into chips are provided between the individual semiconductor memory devices 1.

Most of the scribe line is removed when the semiconductor memory device 1 is cut out, but some part of the scribe line may remain at the end face of the now-chip-shaped semiconductor memory device 1. The above outer peripheral region OR is a portion where such scribe lines remain.

In the example of FIGS. 1A and 1B, the semiconductor memory device 1 has only one stacked structure of word lines WL in the element region ER, but the configuration of the semiconductor memory device 1 is not limited to this. The semiconductor memory device 1 may have a plurality of stacked structures of word lines WL in the element region ER.

The peripheral circuit CBA provided on the semiconductor substrate SB is disposed above the insulating layer 50.

The semiconductor substrate SB is, for example, a silicon substrate. The peripheral circuit CBA including a transistor TR and wiring is disposed on the surface of the semiconductor substrate SB. Various voltages applied from the contacts CC to the memory cells are controlled by the peripheral circuit CBA electrically connected to the contacts CC. Thereby, the peripheral circuit CBA controls the electrical operation of the memory cell.

The peripheral circuit CBA is covered with an insulating layer 40, and the insulating layer 40 and the insulating layer 50 covering the stacked body LM are bonded to form the semiconductor memory device 1 including the configuration of the plurality of word lines WL, pillars PL, and contacts CC, and the peripheral circuit CBA.

Figure 2A:
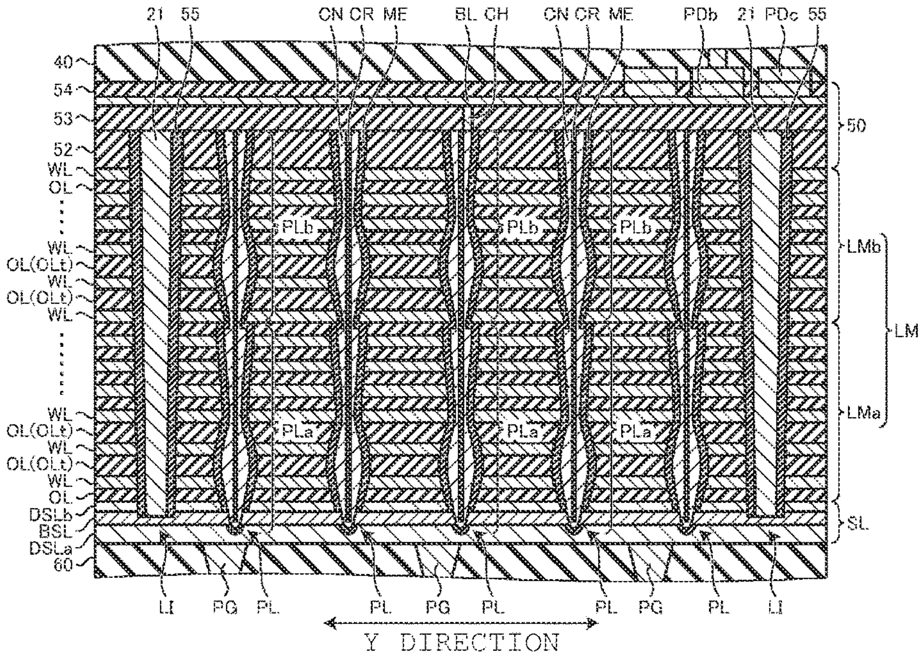
FIGS. 2A to 2C are cross-sectional views of the semiconductor memory device according to Embodiment 1.
Figure 2B:
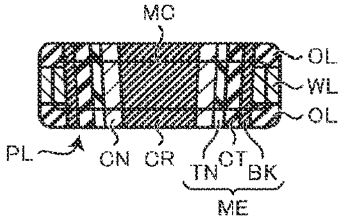
Figure 2C:
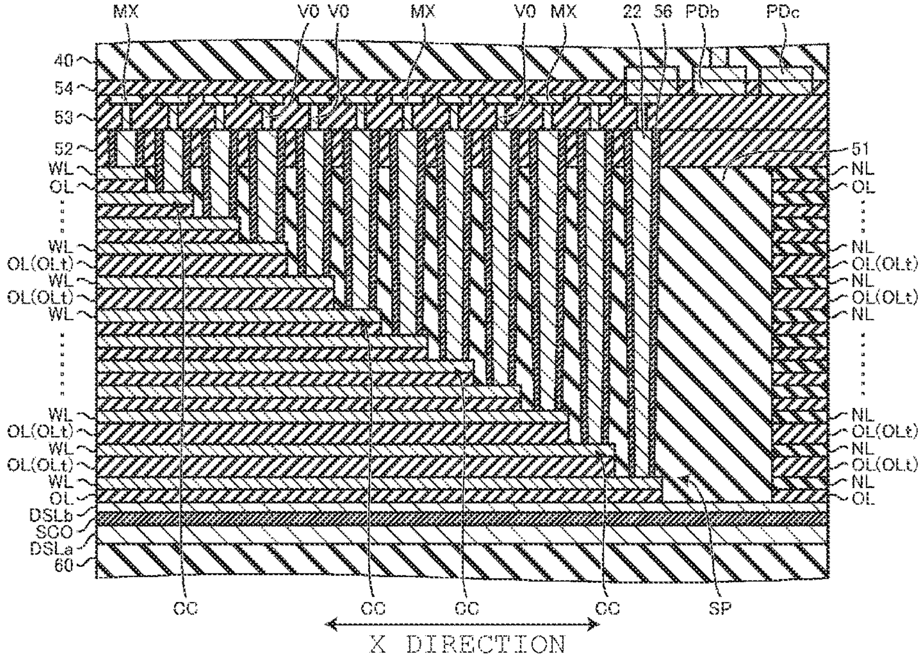

Next, a detailed configuration example of the semiconductor memory device 1 will be described with reference to FIGS. 2A to 2C. FIGS. 2A to 2C are cross-sectional views showing an example of the configuration of the semiconductor memory device 1 according to Embodiment 1.

FIG. 2A is a cross-sectional view including the memory region MR. FIG. 2B is a partially enlarged view showing a cross section of the pillar PL disposed in the memory region MR. FIG. 2C is a cross-sectional view including the staircase region SR and the outer peripheral region OR.

In FIGS. 2A and 2C, structures above the insulating layer 40, such as the semiconductor substrate SB and the peripheral circuit CBA, and structures below the insulating layer 60, such as the electrode film 20, are omitted.

As shown in FIGS. 2A and 2C, the source line SL is disposed on the insulating layer 60 provided with the plug PG. The source line SL as the lower layer film has a multilayer structure in which, for example, the source line DSLa, the intermediate source line BSL or the intermediate insulating layer SCO, and the source line DSLb are stacked in this order from the insulating layer 60 side.

The source line DSLa, the intermediate source line BSL, and the source line DSLb are, for example, polysilicon layers. Among them, at least the intermediate source line BSL may be a conductive polysilicon layer in which impurities are diffused. The intermediate source line BSL is disposed below the memory region MR of the stacked body LM. The intermediate insulating layer SCO is, for example, a silicon oxide layer. The intermediate insulating layer SCO is disposed below the staircase region SR of the stacked body LM.

The stacked body LM is disposed above the source line SL. Insulating layers 52, 53, and 54 are disposed in this order on the stacked body LM. Further, as shown in FIG. 2C, an insulating layer 51 is interposed between these insulating layers 52 to 54 and the stacked body LM in the staircase region SR. These insulating layers 51 to 54 form part of the insulating layer 50 in FIGS. 1A and 1B.

In the stacked body LM, a plurality of word lines WL and a plurality of insulating layers OL are alternately stacked one by one. The word line WL is, for example, a tungsten layer or a molybdenum layer. The insulating layer OL is, for example, a silicon oxide layer.

More specifically, the stacked body LM includes a stacked body LMa as a first stacked body, and a stacked body LMb as a second stacked body. The stacked body LMa has a configuration in which word lines WL as a plurality of first conductive layers and insulating layers OL as a plurality of first insulating layers are alternately stacked one by one on the source line SL. The stacked body LMb has a configuration in which word lines WL as a plurality of second conductive layers and insulating layers OL as a plurality of second insulating layers are alternately stacked on the stacked body LMa.

One or more select gate lines may be stacked via the insulating layer OL in a layer further below the word line WL in the lowermost layer of the stacked body LMa and in a layer further above the word line WL in the uppermost layer of the stacked body LMb. There are any number of layers of these word lines WL and select gate lines in the stacked body LM. The number of layers of the word lines WL may be, for example, several tens to several hundreds.

The stacked body LMa includes insulating layers OLt that are thicker than other insulating layers OL provided in the stacked body LMa. These insulating layers OLt are disposed, for example, on the lower layer side of the stacked body LMa, in the positions excluding the lowest layer of the stacked body LMa.

More specifically, for example, with the height of the top surface of the stacked body LMa relative to the height of the bottom surface of the stacked body LMa being 100%, these insulating layers OLt are disposed in at least one of the height positions, within the range of 20% or more and 50% or less.

The stacked body LMb includes insulating layers OLt that are thicker than other insulating layers OL provided in the stacked body LMb. These insulating layers OLt are disposed, for example, on the lower layer side of the stacked body LMb, in the positions excluding the lowest layer of the stacked body LMb.

More specifically, for example, with the height of the top surface of the stacked body LMb relative to the height of the bottom surface of the stacked body LMb being 100%, these insulating layers OLt are disposed in at least one of the height positions, within the range of 20% or more and 50% or less.

It should be noted that insulating layers OL excluding these insulating layers OLt provided in the stacked bodies LMa and LMb have, for example, substantially the same layer thickness as the word lines WL. Therefore, the layer thickness of the insulating layer Ot is set thicker than the layer thicknesses of the other insulating layers OL and the word lines WL.

Hereinafter, when the insulating layers OLt provided in each of the stacked bodies LMa and LMb are not distinguished from the other insulating layers OL, the insulating layers may be uniformly referred to as insulating layers OL.

A plurality of plate-like contacts LI divide the stacked body LM in the Y direction.

These plate-like contacts LI are aligned in the Y direction and extend in the stacking direction and the X direction of the stacked body LM. That is, the plate-like contacts LI continuously extend in the stacked body LM from one end to the other end in the X direction of the stacked body LM. Thereby, the stacked body LM is divided in the Y direction.

More specifically, the plate-like contact LI reaches the intermediate source line BSL through the insulating layer 52, the stacked body LM, and the source line DSLb, in the memory region MR. Further, in the staircase region SR, the plate-like contact LI reaches the intermediate insulating layer SCO through the insulating layers 52 and 51, at least part of the stacked body LM, and the source line DSLb.

Each plate-like contact LI includes an insulating layer 55 and a conductive layer 21. The insulating layer 55 is, for example, a silicon oxide layer. The conductive layer 21 is, for example, a tungsten layer or a conductive polysilicon layer.

The insulating layer 55 covers sidewalls of the plate-like contacts LI facing each other in the Y direction. The conductive layer 21 is filled inside the insulating layer 55, and is electrically connected to the source lines SL including the intermediate source line BSL, as shown in FIG. 2A. Further, the conductive layer 21 is connected to an upper layer wiring via a plug or the like.

With such a configuration, the plate-like contact LI functions as a source line contact. However, instead of the plate-like contacts LI, the stacked body LM may be divided in the Y direction by plate-like members made of, for example, insulating layers. In such a case, the plate-like member does not function as a source line contact.

As shown in FIG. 2A, a plurality of pillars PL extending in the stacking direction of the stacked body LM in the stacked body LM are dispersedly disposed between the individual plate-like contacts LI of the memory region MR. The plurality of pillars PL are disposed in, for example, a zigzag pattern when viewed from the stacking direction of the stacked body LM.

Further, the pillar PL reaches the source line DSLa through the insulating layer 52, the stacked body LM, the source line DSLb, and the intermediate source line BSL. More specifically, the pillar PL includes a pillar PLa as a first pillar extending in the stacked body LMa and a pillar PLb as a second pillar extending in the stacked body LMb.

That is, the pillar PLa reaches the source line DSLa through the stacked body LMa, the source line DSLb, and the intermediate source line BSL. Each pillar PLa has, for example, a circular, elliptical, or oval shape as a cross-sectional shape in the direction along the layer direction of the stacked body LMa, that is, in the direction along the XY plane.

Further, each pillar PLa has separate bowed shapes in its lower part and upper part. In this context, the bowed shapes are referred to as a "bowing shape" and indicates the diameter of the pillar PLa is larger at one position as compared to the diameter of the pillar of adjacent, surrounding positions along the pillar PLa. That is, the cross-sectional area in the XY plane at the bowing shape is larger than the cross-sectional area in the XY plane of the periphery (portions of the pillar Pla adjacent to the bowing shape).

The bowing shape of the lower part of the pillar PLa (referred to as the first bowing shape) is positioned at the same height as the thicker insulating layers OLt in the stacked body LMa. The diameter and the cross-sectional area in the XY plane of the bowing shape in the lower part of the pillar PLa is a maximum at the height position of the insulating layer OLt near the central portion (middle height) of these insulating layers OLt along the stacking direction.

The bowing shape in the upper part of the pillar PLa (referred to as the second bowing shape) is located above the first bowing shape in the lower part of the pillar PLa, and is thus at a position closer to the upper end of the pillar PLa.

The pillar PLb of the stacked body LMb is connected to the upper end of the pillar PLa through the insulating layer 52. Each pillar PLb also has, for example, a circular, elliptical, or oval shape as a cross-sectional shape in the direction along the XY plane.

Each pillar PLb has separate bowing shapes in its lower part and upper part. That is, these bowing shapes of each pillar PLb have diameters and cross-sectional areas larger than the diameter and cross-sectional area in the XY plane of the surrounding pillar PLb.

The bowing shape of the lower part of the pillar PLb (referred to as a third bowing shape) is positioned at the same height as a thicker insulating layer OLt in the stacked body LMb. Further, the diameter and the cross-sectional area in the XY plane of the third bowing shape in the lower part of the pillar PLb increase toward the height position of the insulating layers OLt closer to the center of the stacked body LMb along the stacking direction. Therefore, the diameter and the cross-sectional area in the XY plane of the third bowing shape in the lower part of the pillar PLb may be at maximum at the height position of the insulating layer OLt near central portion of the stacked body LMb along the stacking direction.

The bowing shape in the upper part of the pillar PLb (referred to as the fourth bowing shape) is located above the third bowing shape in the lower part of the pillar PLb, and is thus disposed at a position closer to the upper end of the pillar PLb.

The shape of these pillars PLa and PLb, which each have bowing shapes in an upper part and a lower part, may be referred to as a two-step bowing shape or a two-stage bowing shape to reflect these pillar portions having two separate local maxima with respect to diameter (or cross-sectional area).

Each pillar PL (including pillars PLa and PLb collectively) includes a memory layer ME disposed on the outer periphery of the pillar PL, a channel layer CN that is connected to the intermediate source line BSL through the stacked body LM, and a core layer CR (that is the core material of the pillar PL). However, the memory layer ME is not disposed on the pillar PL at the depth position of intermediate source line BSL. The memory layer ME (and the channel layer CN) covers the end (the lowermost end) of the pillar PL on the side of the source line SL.

As shown in FIG. 2B, the memory layer ME has a multi-layer structure in which a block insulating layer BK, a charge storage layer CT, and a tunnel insulating layer TN are stacked in this order from the outer periphery side of the pillar PL.

The channel layer CN is in contact with the intermediate source line BSL at its side surface, thereby electrically connected to the source line SL including the intermediate source line BSL. The channel layer CN is connected to the bit line BL extending in a direction along the Y direction in the insulating layer 54 via the plug CH disposed in the insulating layers 52 and 53.

The bit line BL is connected to the electrode pad PDc disposed in the insulating layer 40 via the electrode pad PDb disposed in the insulating layer 54. The electrode pads PDc are electrically connected to the peripheral circuit CBA (see FIGS. 1A and 1B) covered with the insulating layer 40. Thereby, the channel layer CN of the pillar PL is electrically connected to the peripheral circuit CBA.

The block insulating layer BK and tunnel insulating layer TN of the memory layer ME, and the core layer CR are, for example, silicon oxide layers. The charge storage layer CT of the memory layer ME is, for example, a silicon nitride layer. The channel layer CN is, for example, a semiconductor layer such as a polysilicon layer or an amorphous silicon layer.

With this configuration, memory cells MC are formed in the portions of the side surfaces of the pillars PL that face the individual word lines WL. Data is written to and read from the memory cell MC by applying a predetermined voltage from the word line WL.

As shown in FIG. 2C, the staircase region SR has a stepped portion SP. The stepped portion SP has a stepped shape in which a plurality of word lines WL and a plurality of insulating layers OL are processed stepwise. The stepped portion SP extends in the X direction at the positions of respective ends of the stacked body LM (see FIG. 1A), and descends toward the source line SL as it separates from the memory region MR in the central portion of the stacked body LM. The insulating layer 51 that covers the stepped portion SP and extends to the periphery thereof is disposed between the stepped portion SP and the insulating layer 52.

A contact CC penetrating through the insulating layers 51 and 52 is connected to the word line WL forming each step of the stepped portion SP.

The contact CC has an insulating layer 56 covering the outer periphery of the contact CC, and a conductive layer 22 such as a tungsten layer or a copper layer filled in the insulating layer 56. The conductive layer 22 is connected to the wiring MX disposed in the insulating layer 54 via the plug V0 disposed in the insulating layer 53. The wiring MX is electrically connected to the peripheral circuit CBA (see FIGS. 1A and 1B) through the electrode pads PDb and PCc.

With such a configuration, the word lines WL in each layer can be electrically drawn out. That is, with the above configuration, a predetermined voltage is applied from the peripheral circuit CBA to the memory cell MC through the electrode pads PDc and PCb, the contact CC, and the word line WL, thereby operating the memory cell MC as a memory element.

In the staircase region SR, a plurality of columnar portions extending the stacked body LM and the insulating layers 52 and 51 in the stacking direction of the stacked body LM are dispersedly disposed. When forming the stacked body LM from the stacked body in which the sacrificial layers and the insulating layers are stacked, the columnar portion supports these components.

Further, in the outer peripheral region OR (see FIGS. 1A and 1B) of the stacked body LM, stacked bodies LMs surround the stacked body LM at a position away from the stacked body LM. The stacked body LMs has a configuration in which the plurality of insulating layers NL and the plurality of insulating layers OL are alternately stacked one by one. The plurality of insulating layers NL are made of a material different from the material of the insulating layer OL, such as a silicon nitride layer.

More specifically, the stacked body LMs includes a stacked body LMsa and a stacked body LMsb. The stacked body LMsa includes insulating layers OLt disposed at the same height positions as these insulating layers OLt so as to correspond to the insulating layers OLt of the stacked body LMa. The stacked body LMsb also includes insulating layers OLt disposed at the same height positions as these insulating layers OLt so as to correspond to the insulating layers OLt of the stacked body LMb.

(Manufacturing method of semiconductor memory device)

Next, a manufacturing method of the semiconductor memory device 1 of Embodiment 1 will be described with reference to FIGS. 3A to 11. FIGS. 3A to 11 are diagrams illustrating parts the procedure of the manufacturing method of the semiconductor memory device 1 according to Embodiment 1 in sequence.

First, FIGS. 3A to 3C and FIGS. 4A and 4B show how the pillars PL are formed. FIGS. 3A to 3C and FIGS. 4A and 4B show cross sections of the memory region MR during manufacture.

Figure 3A:
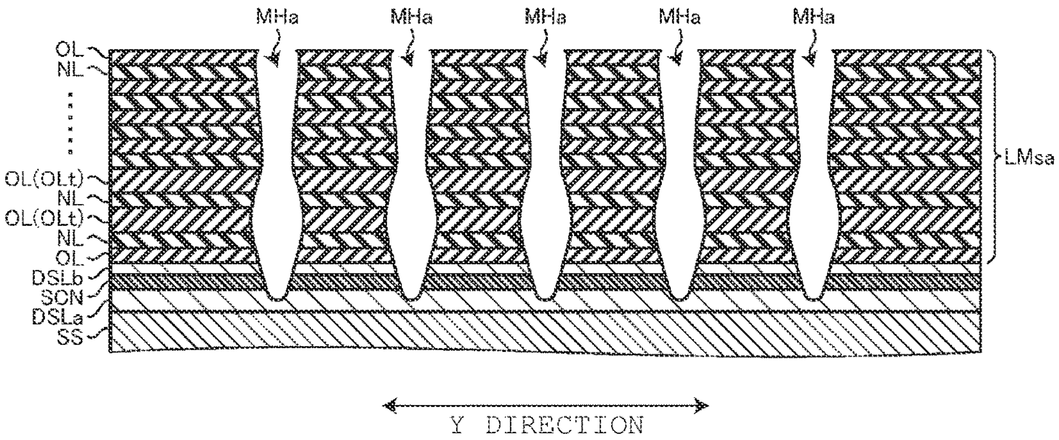
FIGS. 3A to 3C are diagrams illustrating a part of a procedure of a manufacturing method of the semiconductor memory device according to Embodiment 1.

As shown in FIG. 3A, the source line DSLa, the intermediate sacrificial layer SCN, and the source line DSLb are formed in this order on the supporting substrate SS. The supporting substrate SS may be, for example, a semiconductor substrate such as a silicon substrate, an insulating substrate such as a ceramic substrate or a quartz substrate, or a conductive substrate such as a sapphire substrate. The source lines DSLa and DSLb are, for example, polysilicon layers. The intermediate sacrificial layer SCN is, for example, a silicon nitride layer, and is a portion later replaced with conductive polysilicon to become the intermediate source line BSL.

Further, as a second stacked body in which insulating layers NL as a plurality of first insulating layers and insulating layers OL as a plurality of second insulating layers are alternately stacked one by one, a stacked body LMsa is formed on the source line DSLb. The insulating layer NL is, for example, a silicon nitride layer, and functions as a sacrificial layer that is later replaced with a conductive material and becomes the word line WL. The stacked body LMsa is a portion that becomes the stacked body LMa later by such a replacement process.

Such a stacked body LMsa is formed using, for example, a plasma chemical vapor deposition (CVD) method. In this case, when forming the insulating layer OL, a silane-based gas such as monosilane ($SiH_4$) and an oxidizing gas such as an oxygen ($O_2$) gas are used. When forming the insulating layer NL, a silane-based gas such as monosilane ($SiH_4$) and a nitriding gas such as ammonia ($NH_3$) gas are used.

In this case, the stacked body LMa has the insulating layer OLt, which is thicker than the other insulating layers OL, at a predetermined position. In order to form the insulating layer OLt thicker, the processing time of the insulating layer OLt may be set longer than the processing time of the other insulating layers OL by the plasma CVD method.

Although not specifically depicted, when the source line DSLa, the intermediate sacrificial layer SCN, and the source line DSLb are formed in the region that becomes the memory region MR, the above-described intermediate insulating layer SCO (see FIG. 2C), instead of the intermediate sacrificial layer SCN, is formed in the region that will later become the staircase region SR.

Furthermore, the portions of the stepped portion SP that are disposed in the stacked body LMa are formed at respective ends of the stacked body LMsa in the X direction. The stepped shape at the end of the stacked body LMsa is obtained by forming a resist layer or the like on the upper surface of the stacked body LMsa, slimming the resist layer using oxygen plasma, and processing the stacked body LMsa from the upper surface side.

Further, in the region to be the memory region MR, a plurality of memory holes MHa are formed from the upper surface of the stacked body LMsa to reach the source line DSLa through the stacked body LMsa, the source line DSLb, and the intermediate sacrificial layer SCN.

The plurality of memory holes MHa are formed by, for example, plasma etching at a low temperature. Specifically, for example, the supporting substrate SS is placed on a stage cooled to 0° C. or less, more preferably −10° C. or less, and a stacked body LMSsa having a resist layer thereon with a hole pattern is etched using plasma of hydrofluorocarbon ($C_xH_yF_z$)-based gas.

Under such conditions, etching proceeds while deposits are being deposited on the processing surface of the stacked body LMsa, such as the side surface of the memory hole MHa currently in the process of being formed. Such deposits can be due to a reaction in the plasma between the fluorocarbon-based gas, a hydrogen gas and materials (elements) of the insulating layers NL and OL. As an example, the deposit may include $(NH_4)_xSiF_y$. The nitrogen contained in a deposit, such as $(NH_4)_xSiF_y$, and the silicon in such a deposit originates from the insulating layer NL, which is, for example, a silicon nitride layer.

The deposit deposited on the side surface of the memory hole MHa has the function of protecting the side surface of the memory hole MHa from the plasma. Therefore, by adjusting plasma conditions in various ways, the amount of deposition can be adjusted, and the memory hole MHa having a desired shape, such as a straight sidewall shape, a tapered shape, or a bowing shape can be formed. It should be noted that under the above conditions, deposits are more likely to be generated during etching of the insulating layer NL than the insulating layers OL.

At the beginning of etching, there is relatively little deposition during processing of the upper layer side of the stacked body LMa, so the side surfaces of the memory hole MHa are not protected from the plasma at this point, and the memory hole MHa formed by this process has a bowing shape at its upper part. When the etching proceeds to some extent, the memory hole MHa gradually becomes tapered due to deposits being formed on the side surfaces of the memory hole MHa.

However, an insulating layer OLt (thicker than other insulating layers OL) is formed on the lower layer side of the stacked body LMsa. When the insulating layers OL and OLt are being etched, the amount of deposition generated in the etch processing decreases as compared to when an insulating layer NL is being etched. Therefore, the memory hole MHa will also have a bowing shape at its lower part.

Thus, a memory hole MHa having a two-step bowing shape, that is, a bowing shape at the upper part and a bowing shape at the lower part is formed, similarly to the shape already described for pillar PLa.

Figure 3B:
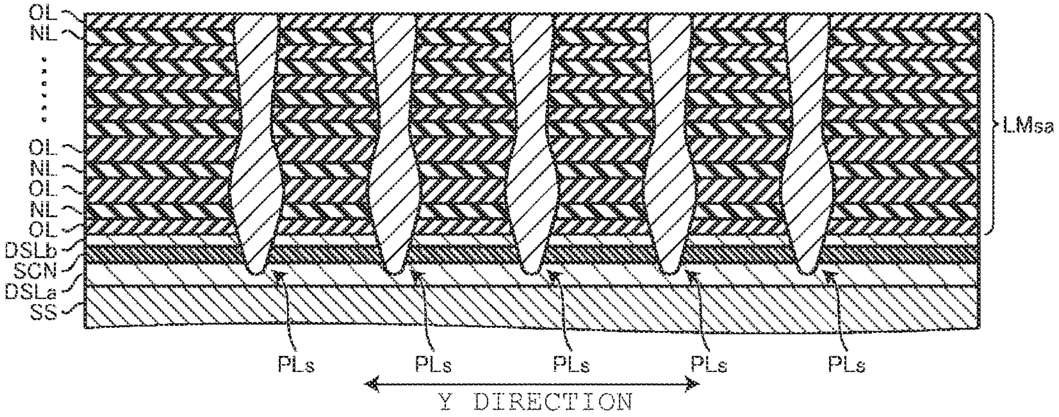

As shown in FIG. 3B, the insides of the memory holes MHa are filled with a sacrificial layer such as an amorphous silicon layer to form a plurality of pillars PLs.

Figure 3C:
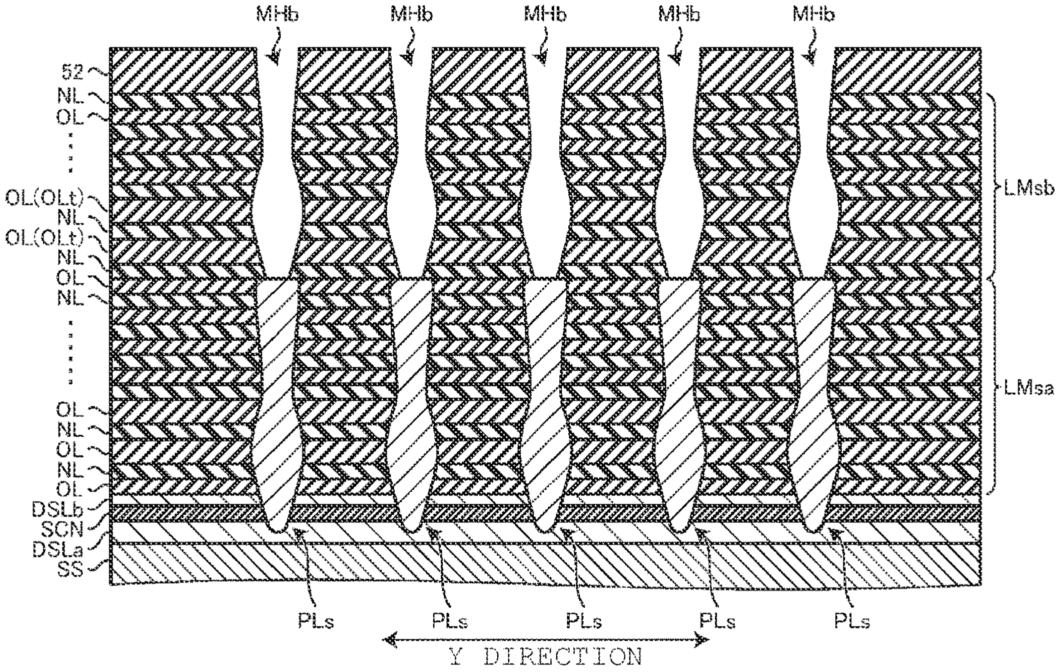

As shown in FIG. 3C, a stacked body LMsb in which a plurality of insulating layers NL and a plurality of insulating layers OL are alternately stacked one by one is formed on the stacked body LMsa in which the plurality of pillars PLs are formed. The stacked body LMsb is a portion that will later become the stacked body LMb. Such a stacked body LMsb can also be formed by appropriately changing the gas type, for example, by a plasma CVD method, similar to the stacked body LMsa.

In the stacked body LMb, the insulating layer OLt, which is thicker than the other insulating layers OL, can be formed at a predetermined position. The insulating layer 52 is then formed on the stacked body LMsb.

For example, after the stacked body LMsb is formed, portions of the stepped portion SP that are disposed in the stacked body LMb are formed at respective ends of the stacked body LMsb in the X direction. The stepped shape at the end of the stacked body LMsb is obtained by, for example, processing the stacked body LMsb from the upper surface side while slimming the resist layer, similar to the stepped shape formed on the stacked body LMsa.

Further, the stepped shapes formed in the stacked bodies LMsa and LMsb are covered with the insulating layer 51

(see FIGS. 2A to 2C). Thereafter, the entire upper surface of the stacked body including the staircase region SR is covered with the insulating layer 52.

In the region to be the memory region MR, a plurality of memory holes MHb are formed that reach the pillars PLs formed in the stacked body LMsa. The plurality of memory holes MHb are also formed by, for example, plasma etching at a low temperature, similar to the memory holes MHa.

That is, for example, the supporting substrate SS is placed on a stage cooled to 0° C. or less, more preferably −10° C. or less, and a stacked body LMSsb having a resist layer (having a hole pattern) on its upper surface is etched using plasma of hydrofluorocarbon ($C_xH_yF_z$)-based gas.

By such a process, deposits of an amount corresponding to the depth of the memory holes MHb in the process of being formed are also deposited on the side surfaces of the memory holes MHb, and the memory holes MHb have a bowing shape located on the upper layer side of the stacked body LMb and a bowing shape located at the height of the insulating layer OLt, which is thicker than other insulating layers, on the lower layer side of the stacked body LMsb.

Thus, a memory hole MHb having a two-step bowing shape, that is, bowing shapes at the upper part and the lower part is formed, similarly to the above-described pillar PLb.

Figure 4A:
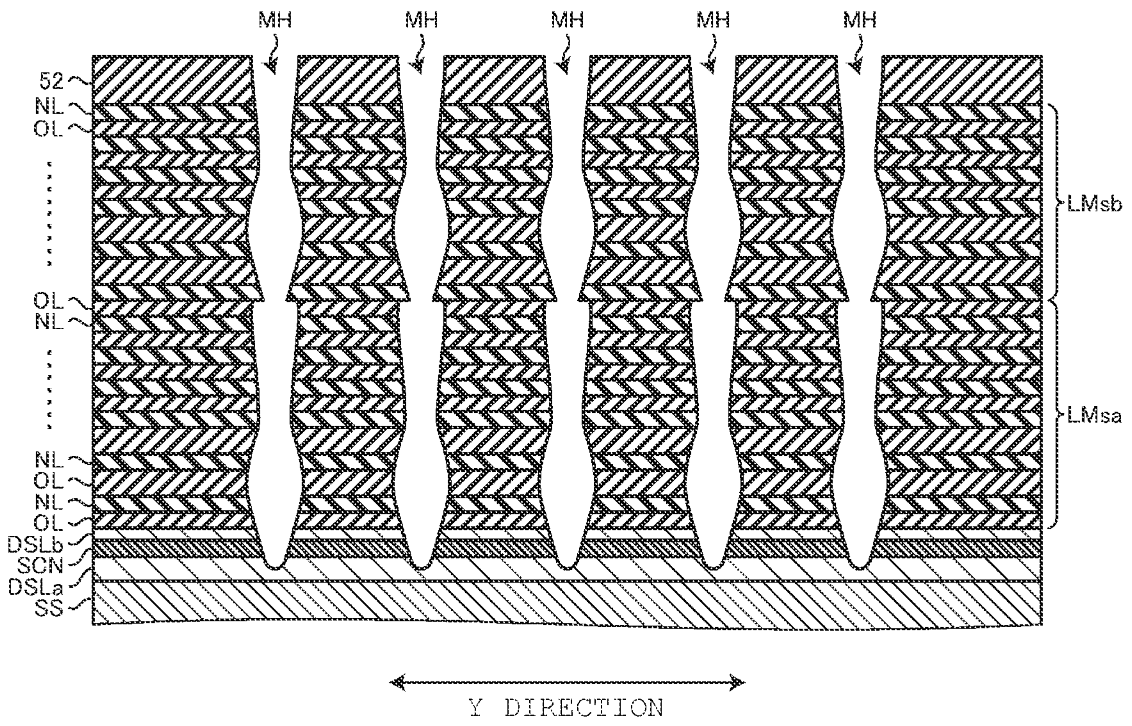
FIGS. 4A and 4B are diagrams illustrating a part of the procedure of the manufacturing method of the semiconductor memory device according to Embodiment 1.

As shown in FIG. 4A, the sacrificial layer filling the memory hole MHa through the memory hole MHb is removed. Thus, a plurality of memory holes MH that penetrate through the insulating layer 52, the stacked bodies LMsb and LMsa, the source line DSLb, and the intermediate sacrificial layer SCN to reach the source line DSLa are formed.

Figure 4B:
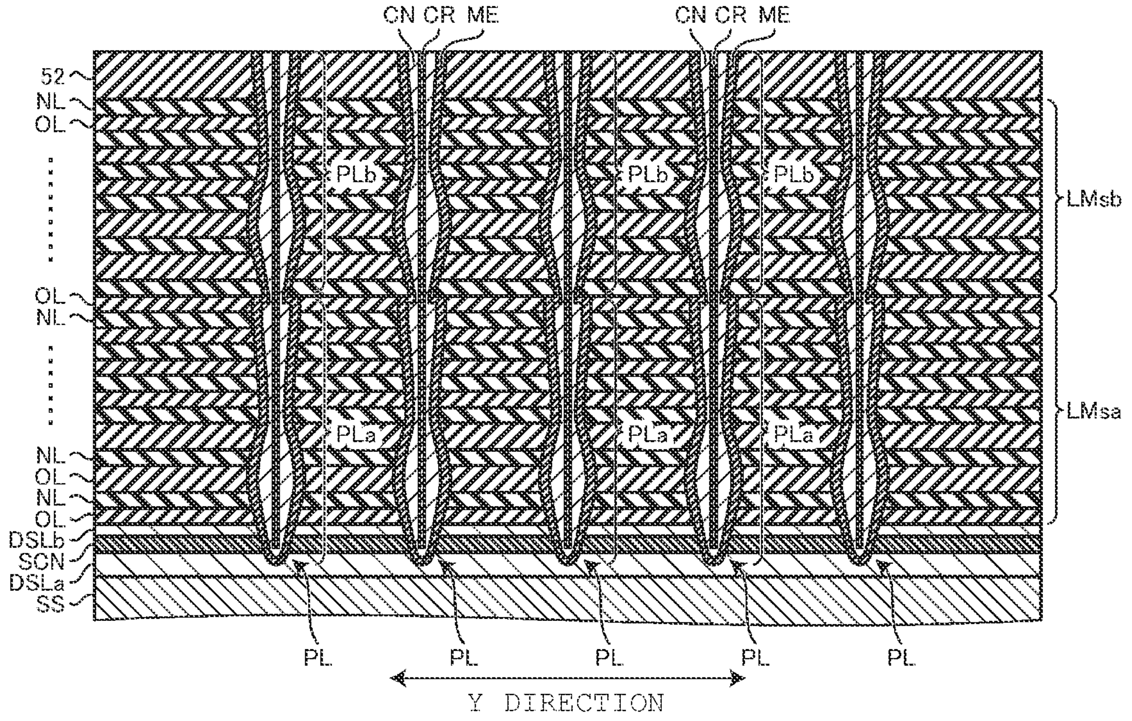

As shown in FIG. 4B, in the memory hole MH, a memory layer ME is formed in which a block insulating layer BK, a charge storage layer CT, and a tunnel insulating layer TN are stacked in this order from the outer periphery side of the memory hole MH. The memory layer ME is also formed on the bottom surface of the memory hole MH. As described above, the block insulating layer BK and the tunnel insulating layer TN are, for example, silicon oxide layers, and the charge storage layer CT is, for example, a silicon nitride layer.

Further, a channel layer CN such as a polysilicon layer or an amorphous silicon layer is formed in the memory layer ME. The channel layer CN is also formed on the bottom surface of the memory hole MH through the memory layer ME. In addition, a core layer CR such as a silicon oxide layer is filled in the channel layer CN.

As described above, a plurality of pillars PL are formed. However, at this stage, the memory layer ME is also formed at the height position of the intermediate sacrificial layer SCN and covers the entire side surface of the channel layer CN.

Next, FIGS. 5A and 5B and FIGS. 6A and 6B show how the intermediate source line BSL is formed. FIGS. 5A and 5B and FIGS. 6A and 6B show cross sections of the memory region MR during manufacture, similar to FIGS. 3A to 3C and FIGS. 4A and 4B.

Figure 5A:
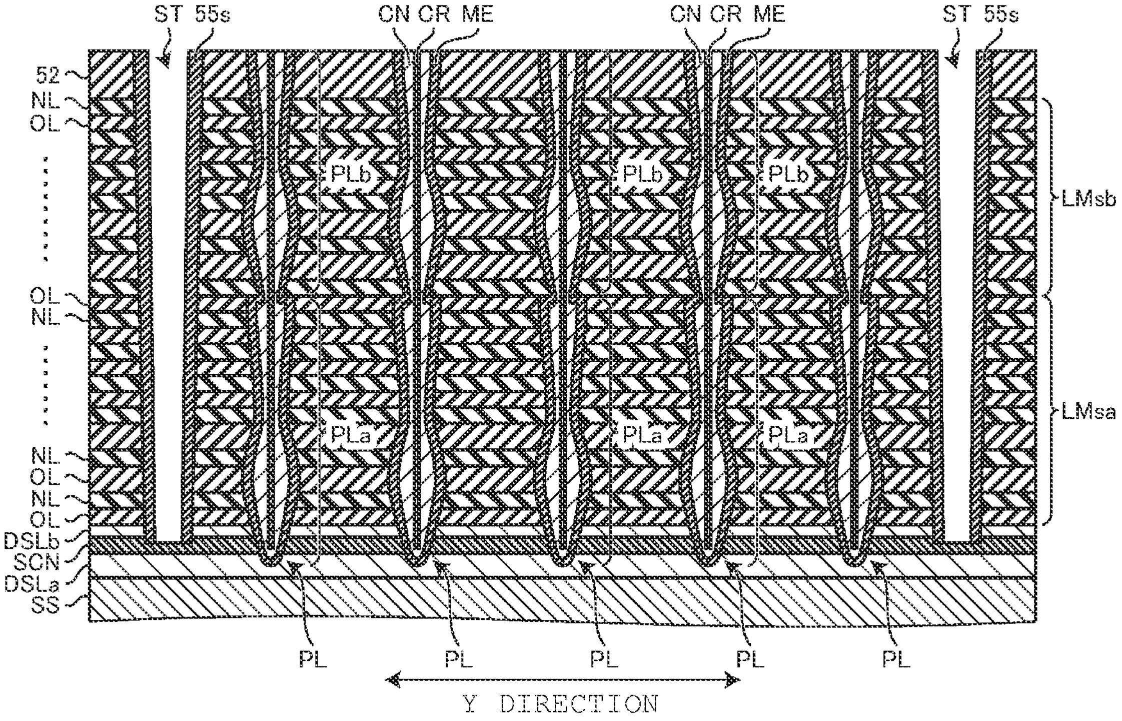
FIGS. 5A and 5B are diagrams illustrating a part of the procedure of the manufacturing method of the semiconductor memory device according to Embodiment 1.

As shown in FIG. 5A, a plurality of slits ST penetrating through the stacked bodies LMsa and LMsb and the source line DSLa to reach the intermediate sacrificial layer SCN are formed at positions where the plate-like contacts LI of the memory region MR are formed. These slits ST also extend in the X direction and divide the stacked bodies LMsa and LMsb in the Y direction.

Further, insulating layers 55_s_ are formed on sidewalls of these slits ST facing each other in the Y direction. The insulating layer 55_s_ is, for example, a silicon oxide layer, and functions as a protective layer for the stacked bodies LMsa and LMsb when forming the intermediate source line BSL.

Figure 5B:
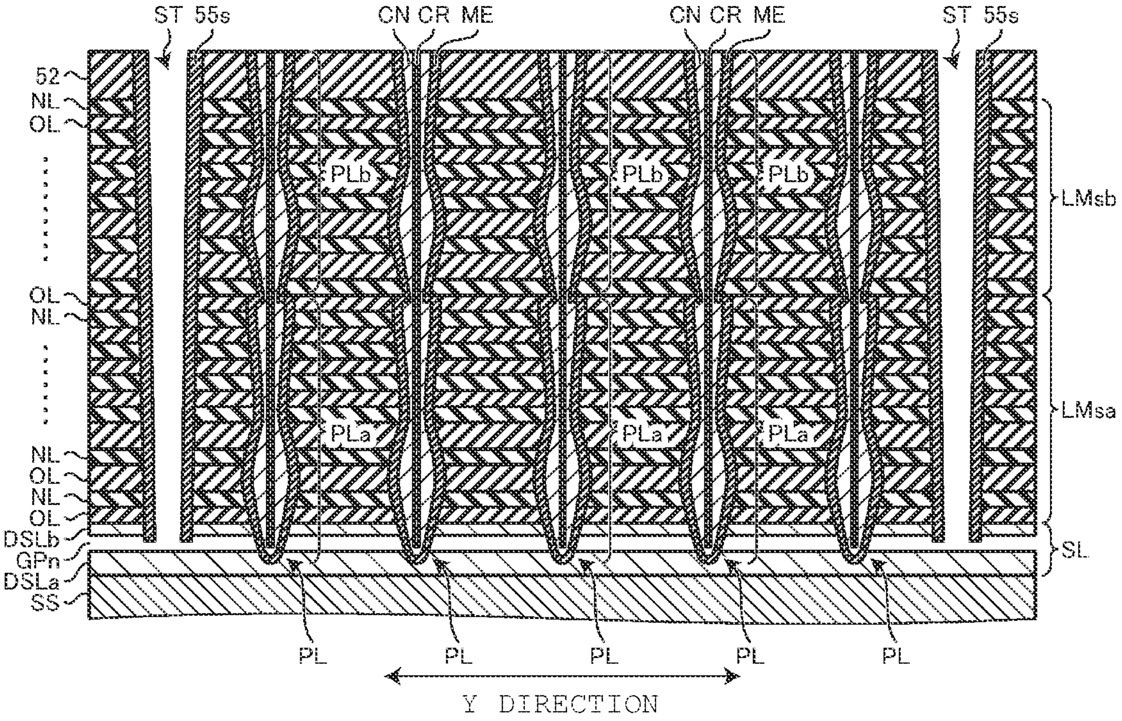

As shown in FIG. 5B, a remover for the intermediate sacrificial layer SCN, such as hot phosphoric acid, is caused to flow from the plurality of slits ST to remove the intermediate sacrificial layer SCN. Thereby, a gap layer GPs is formed between the source lines DSLa and DSLb. A part of the memory layer ME on the outer periphery of the pillar PL is exposed in the gap layer GPs.

In this case, since the insulating layer 55_s_ is formed on the sidewall of the slit ST penetrating through the stacked bodies LMsa and LMsb, removal of the insulating layer NL provided in the stacked bodies LMsa and LMsb is prevented.

Figure 6A:
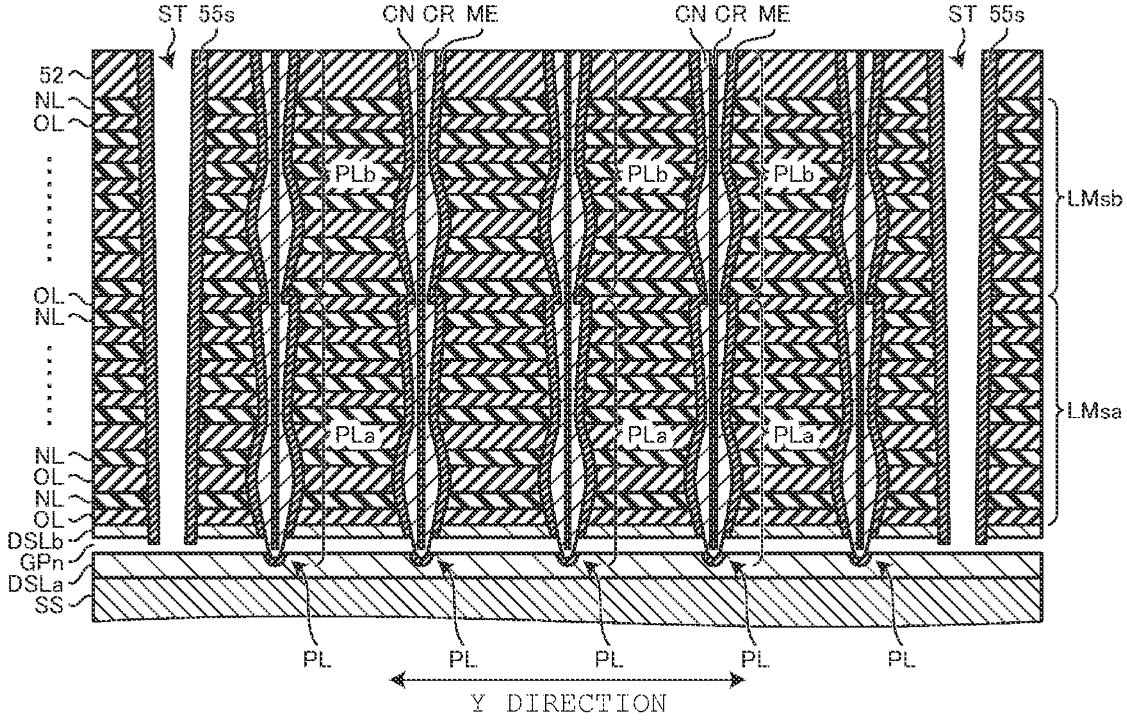
FIGS. 6A and 6B are diagrams illustrating a part of the procedure of the manufacturing method of the semiconductor memory device according to Embodiment 1.

As shown in FIG. 6A, different liquid chemicals are appropriately flowed into the gap layer GPs through the plurality of slits ST, and the block insulating layer BK, the charge storage layer CT, and the tunnel insulating layer TN exposed in the gap layer GPs are removed sequentially. Thus, the memory layer ME is removed from the partial sidewalls of the pillar PL, and the partial sidewalls of the inner channel layer CN are exposed in the gap layer GPs.

Figure 6B:
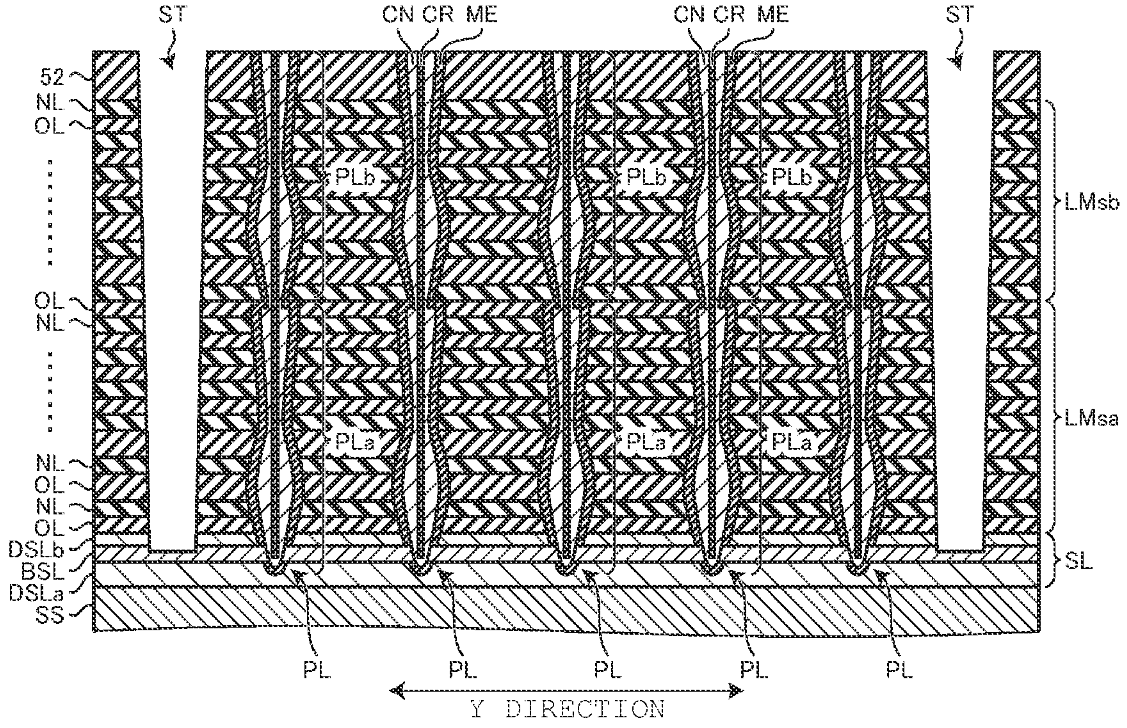

As shown in FIG. 6B, a raw material gas for forming, for example, amorphous silicon is injected from a plurality of slits ST to fill the gap layer GPs with the amorphous silicon. Further, the supporting substrate SS is heat-treated to crystallize the amorphous silicon filled in the gap layer GPs to form the intermediate source line BSL as polysilicon.

Thus, part of the channel layer CN of the pillar PL is connected to the source line SL on the side surface via the intermediate source line BSL.

It should be noted that the processes of forming the intermediate source line BSL shown in FIGS. 5A and 5B and FIGS. 6A and 6B are also referred to as a replacement process of the intermediate source line BSL.

After that, the insulating layer 55_s_ on the sidewall of the slit ST is removed.

Figure 7A:
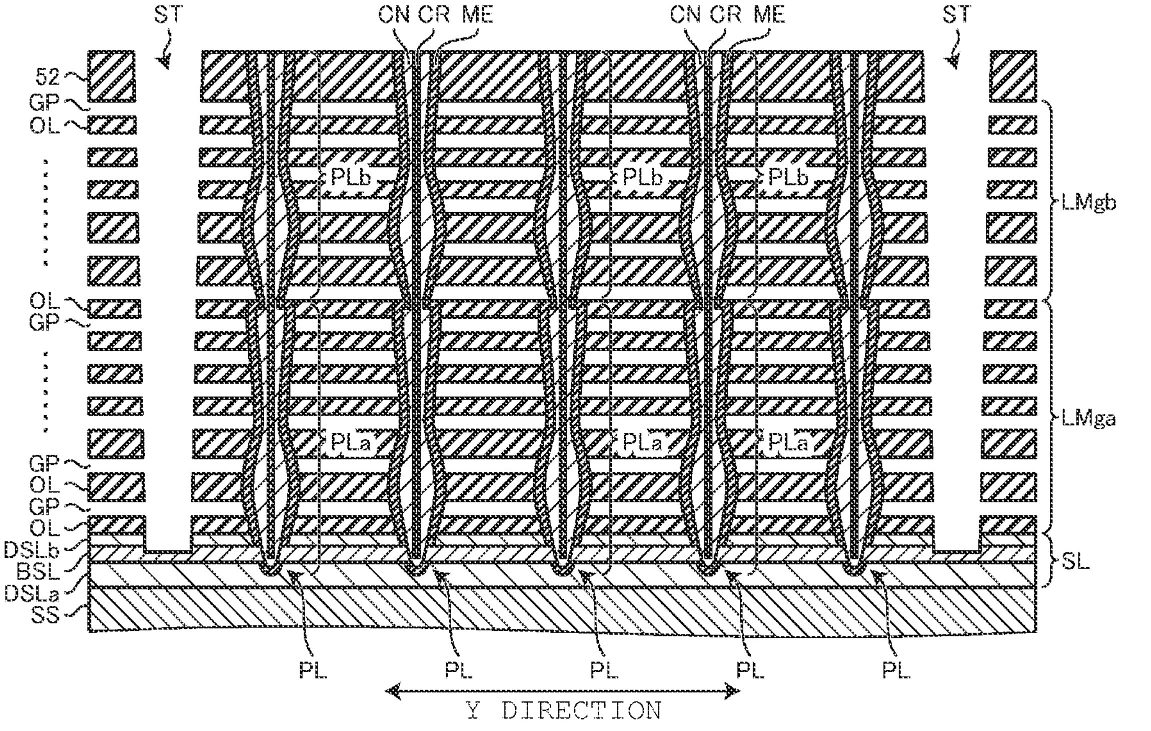
FIGS. 7A and 7B are diagrams illustrating a part of the procedure of the manufacturing method of the semiconductor memory device according to Embodiment 1.
Figure 7B:
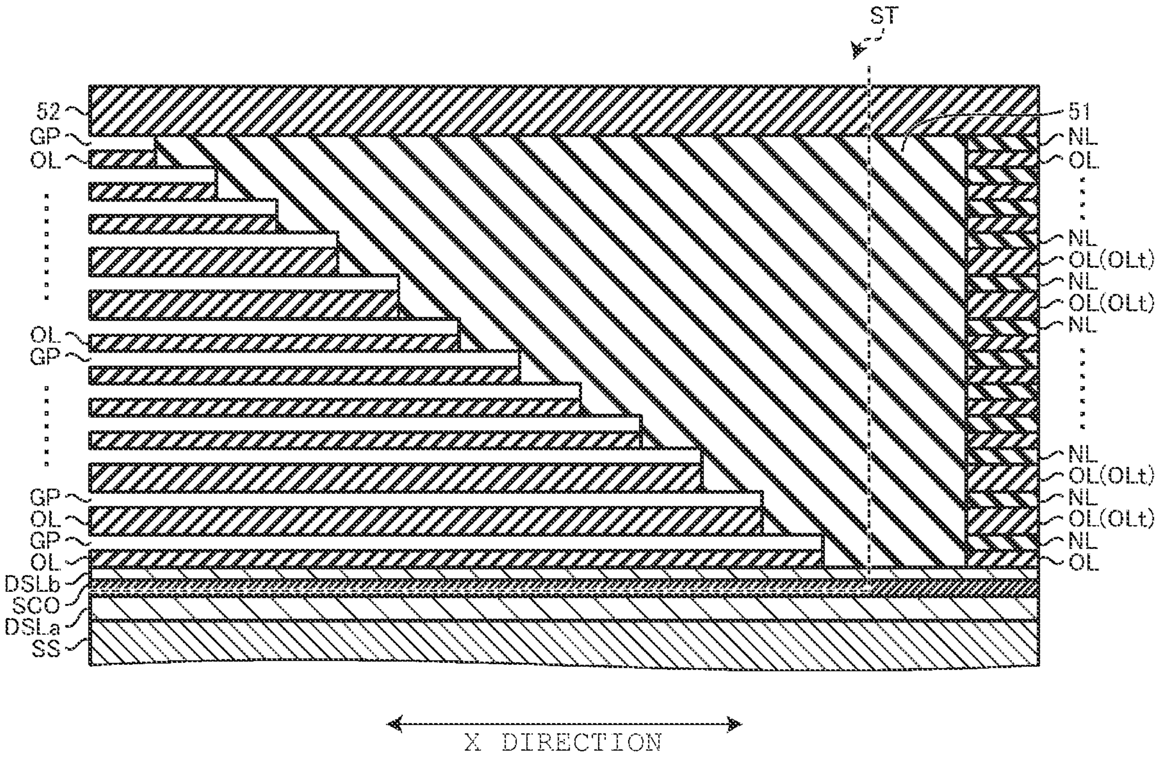
Figure 8A:
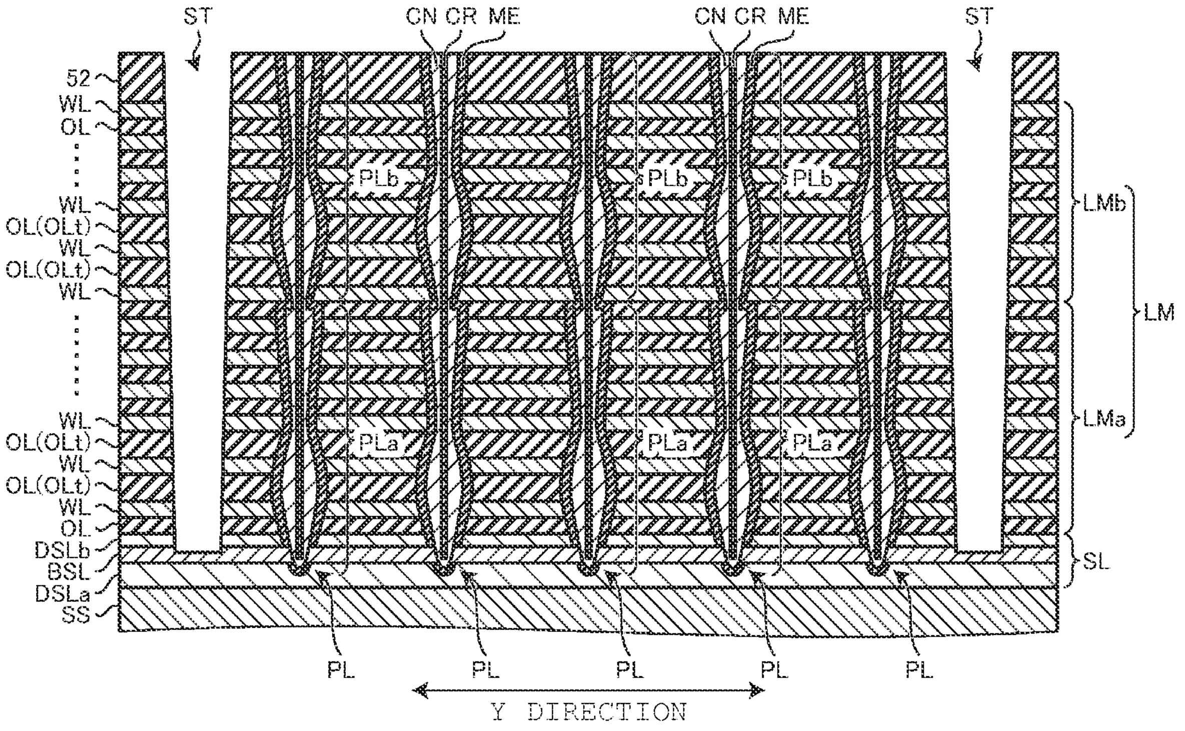
FIGS. 8A and 8B are diagrams illustrating a part of the procedure of the manufacturing method of the semiconductor memory device according to Embodiment 1.
Figure 8B:
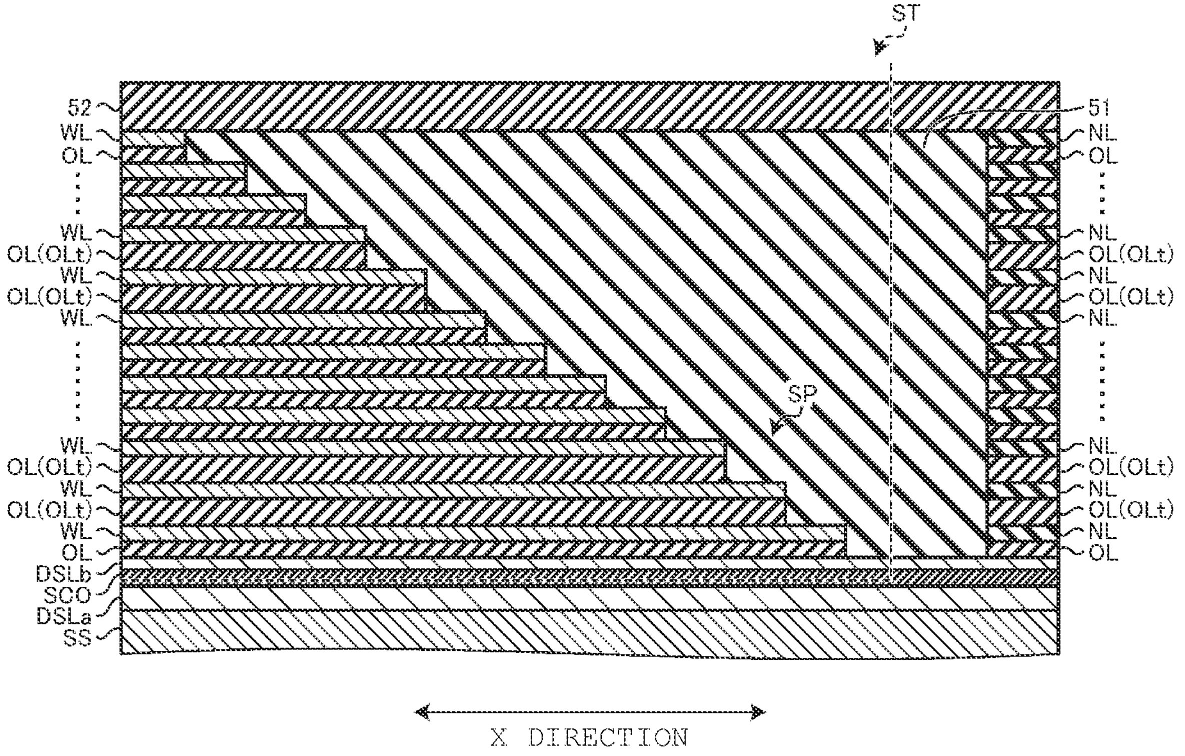

Next, FIGS. 7A and 7B and FIGS. 8A and 8B show how the stacked bodies LMa and LMb are formed. FIGS. 7A and 7B and FIG. 8A show cross sections from one direction of the memory region MR during manufacture, similar to FIG. 3 to FIG. 6B. FIGS. 7A and 7B and FIG. 8B show cross sections of the staircase region SR during manufacture from another direction.

Here, in the staircase region SR, a staircase structure is formed by processing the ends of the stacked bodies LMsa and LMsb stepwise. Such a staircase structure is entirely covered with an insulating layer 51, and an insulating layer 52 further covers the entire stacked bodies LMa and LMb. In the staircase region SR, a plurality of columnar portions are formed in parallel with the formation of the pillars PL described above.

However, in the staircase region SR, an intermediate insulating layer SCO is formed instead of the intermediate sacrificial layer SCN. Since this intermediate insulating layer SCO is, for example, a silicon oxide layer, the intermediate insulating layer SCO can remain without being removed by the replacement process for the intermediate source line BSL described above.

In the outer peripheral region OR (see FIGS. 1A and 1B) outside the staircase region SR in the X direction and outside the stacked bodies LMsa and LMsb in the Y direction, there are stacked bodies LMsa and LMsb separated from the other stacked bodies LMsa and LMsb in which the pillar PL and the staircase structure are formed.

The outer peripheral region OR is a region provided in the scribe line and is disposed outside the element region ER (see FIGS. 1A and 1B). Various types of processes as described above are performed on the element region ER, and generally the peripheral region OR is not subject to these processes.

Therefore, the stacked bodies LMa and LMb separated from the other stacked bodies LMa and LMb having the pillars PL formed thereon by a process of forming a staircase structure may remain on the outer peripheral region OR.

As shown in FIG. 7A, a remover for the insulating layers NL, such as hot phosphoric acid, is caused to flow into the stacked bodies LMsa and LMsb from the slits ST penetrating through the stacked bodies LMsa and LMsb, thereby removing the insulating layers NL of the stacked bodies LMsa and LMsb. Thereby, stacked bodies LMga and LMgb having a plurality of gap layers GP obtained by removing the insulating layers NL between the insulating layers OL are formed.

As shown in FIG. 7B, the removal of the insulating layers NL of the stacked bodies LMsa and LMsb through the slits ST also reaches the staircase region SR. As described above, the slits ST divide the stacked bodies LMsa and LMsb in the Y direction, and reach the outside of the staircase region SR as indicated by broken lines in FIG. 7B. The insulating layer NL in the staircase region SR is also removed through the slit ST.

However, remover via the slit ST may not reach the outer peripheral region OR further outside the staircase region SR. Therefore, the insulating layers NL of the stacked bodies LMsa and LMsb remaining in the outer peripheral region OR are not removed.

It should be noted that the stacked bodies LMga and LMgb including the plurality of gap layers GP have a fragile structure. In the memory region MR, the plurality of pillars PL support such fragile stacked bodies LMga and LMgb. In the staircase region SR, a plurality of columnar portions support the stacked bodies LMga and LMgb. Such a support structure of the pillar PL and the columnar portion prevents the remaining insulating layer OL from flexing and the stacked bodies LMga and LMgb from distorting and collapsing.

As shown in FIGS. 8A and 8B, a raw material gas (precursor gas) for an element such as tungsten or molybdenum, which are a conductive material, is injected via the slit ST into the stacked bodies LMga and LMgb, and the gap layers GP of the stacked bodies LMga and LMgb are filled with a conductive material to form a plurality of word lines WL. Thus, a stacked body LM is formed in which a plurality of word lines WL and a plurality of insulating layers OL are alternately stacked one by one.

In this case, as described above, the slit ST is not formed in the outer peripheral region OR, so the insulating layer NL is still provided in the stacked bodies LMsa and LMsb in the outer peripheral region OR. That is, the stacked bodies LMsa and LMsb formed by the above-described processes of FIGS. 3A and 3C are maintained still in the outer peripheral region OR.

It should be noted that the process of forming the word lines WL shown in FIGS. 7A and 7B and FIGS. 8A and 8B is also referred to as the process of replacing the word lines WL or a replacement process.

Figure 9A:
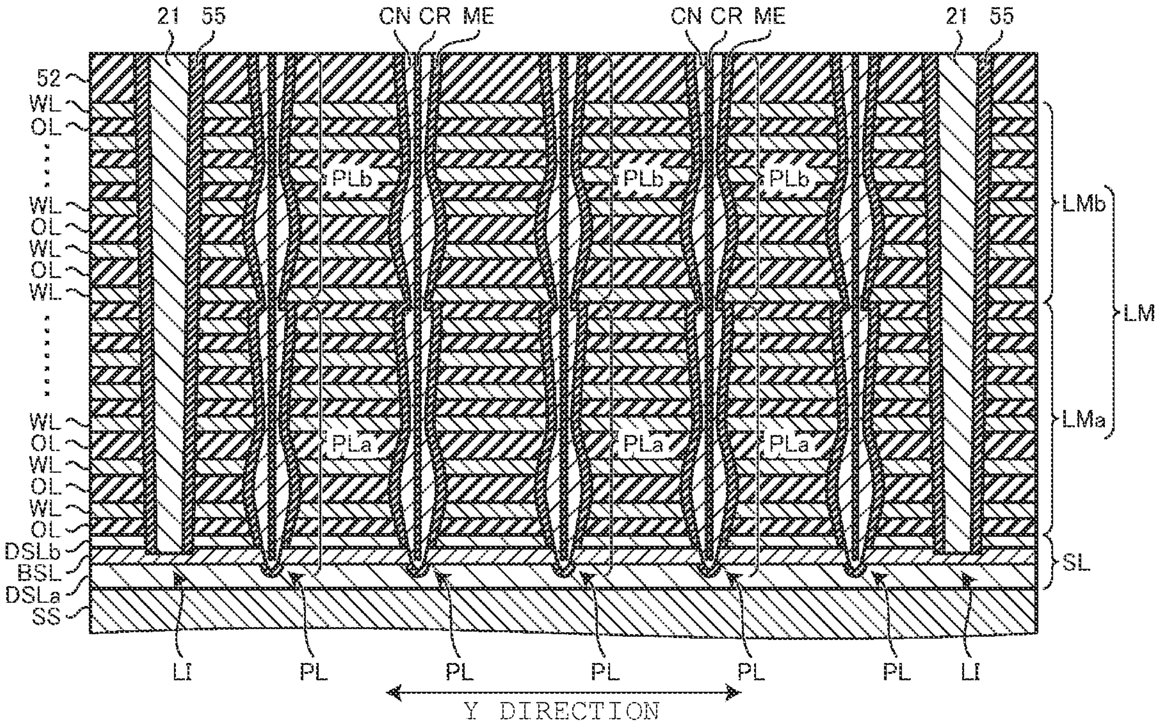
FIGS. 9A and 9B are diagrams illustrating a part of the procedure of the manufacturing method of the semiconductor memory device according to Embodiment 1.
Figure 9B:
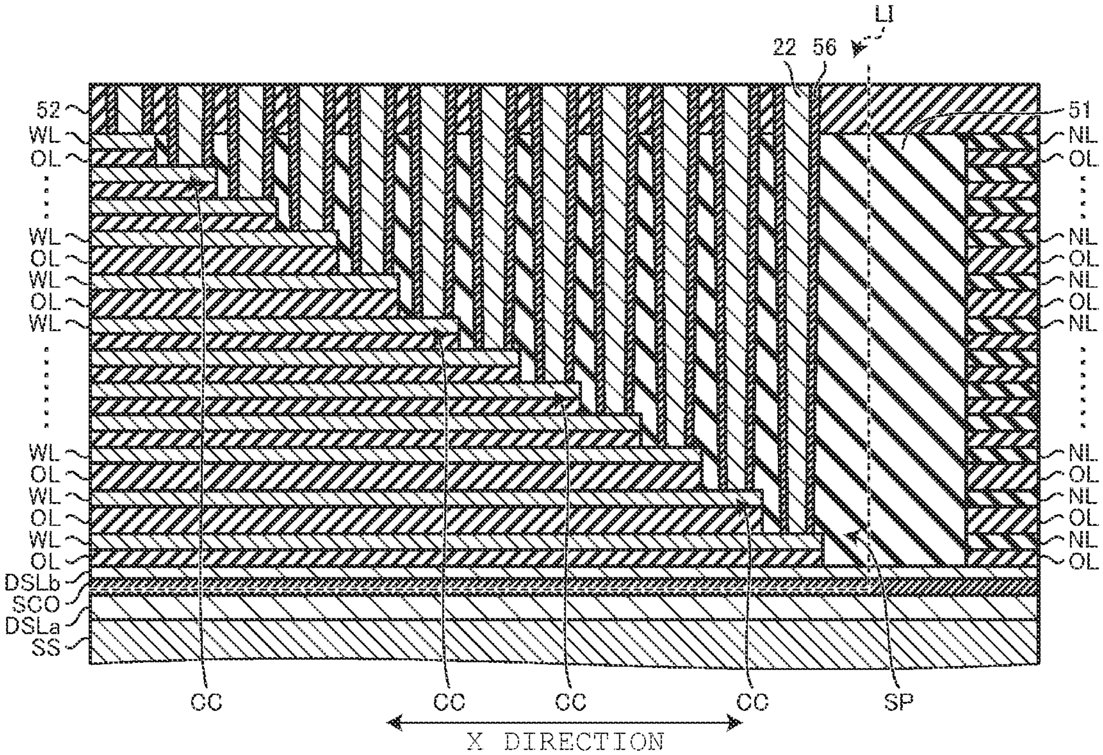
Figure 10A:
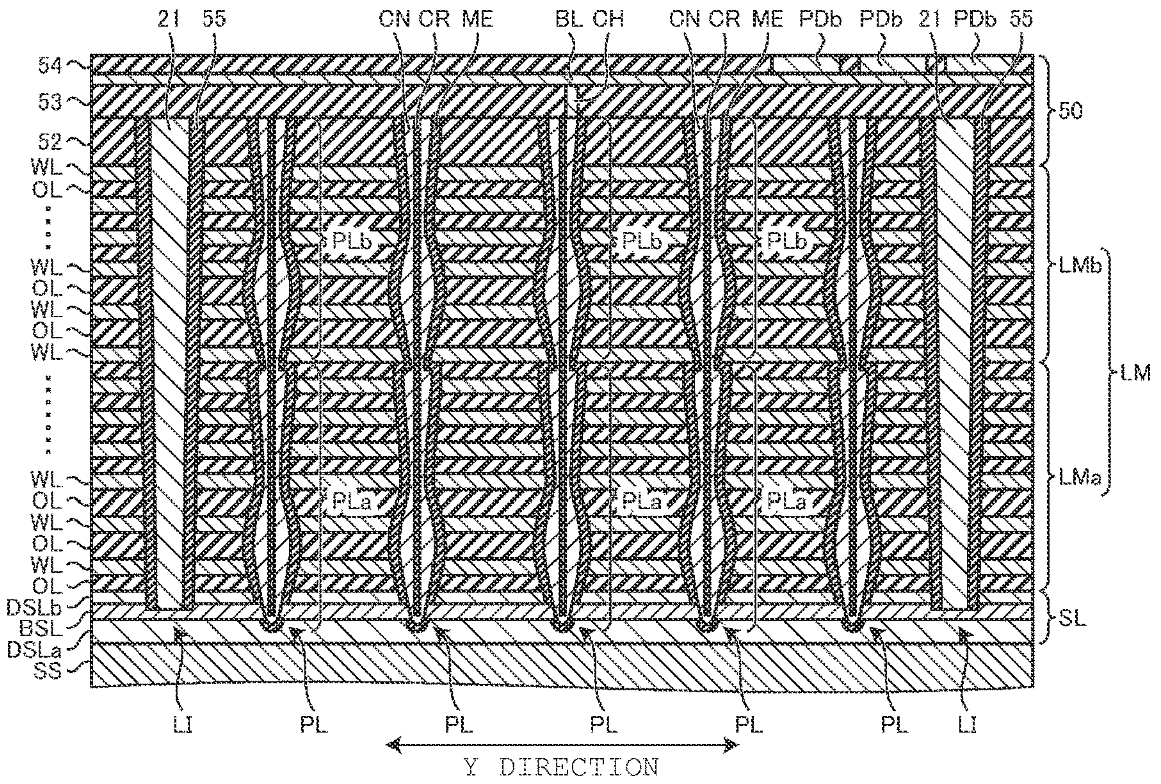
FIGS. 10A and 10B are diagrams illustrating a part of the procedure of the manufacturing method of the semiconductor memory device according to Embodiment 1.
Figure 10B:
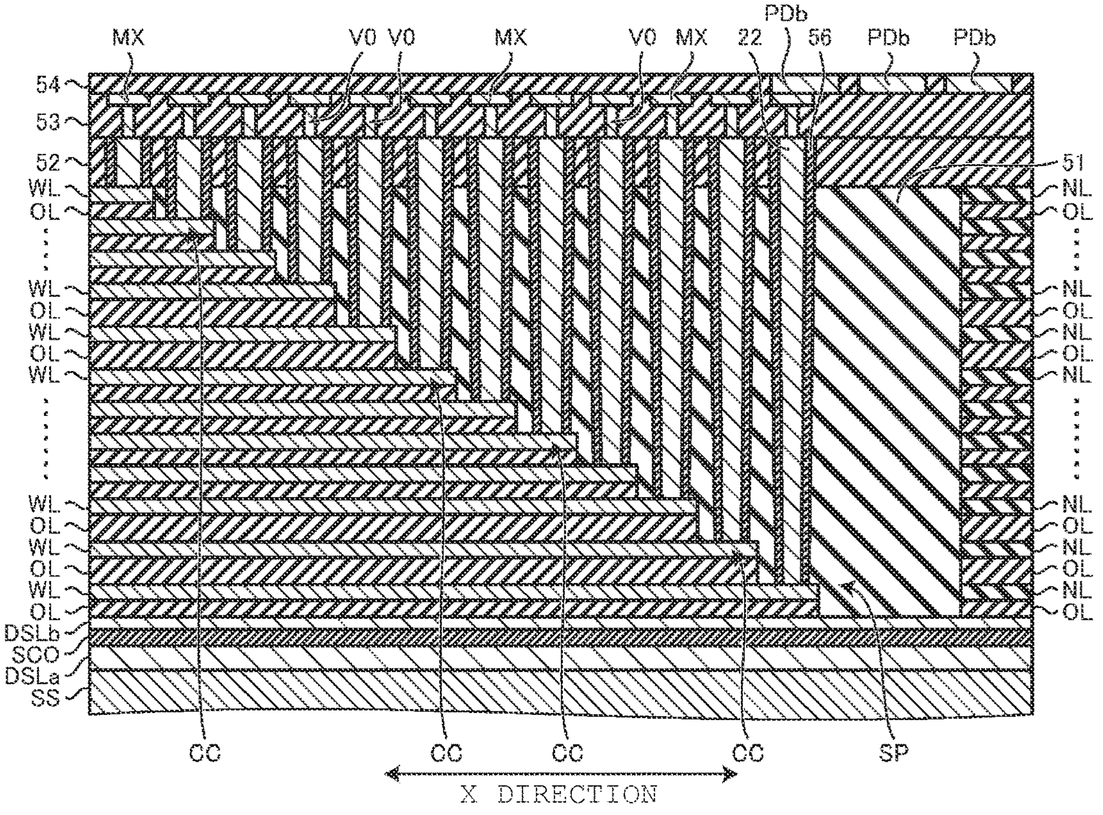

Next, FIGS. 9A to 10B show how plate-like contacts LI, contacts CC, and various upper layer wirings are formed. FIGS. 9A and 9B and FIG. 10A show cross sections from one direction of the memory region MR during manufacture, similar to FIGS. 7A and 7B and FIG. 8A. FIGS. 9A and 9B and FIG. 10B show cross sections from another direction of the staircase region SR during manufacture, similar to FIGS. 7A and 7B and FIG. 8B.

As shown in FIG. 9A, the insulating layers 55 are formed on the sidewalls of the slit ST facing each other in the Y direction, and the inside of the insulating layers 55 is filled with the conductive layer 21. Thereby, the plate-like contacts LI are formed. However, as described above, the slit ST may be filled with, for example, the insulating layer 55 to form a plate-like member that does not function as the source line contact. In this case, the slit ST is formed exclusively for the replacement process of the word line WL.

As shown in FIG. 9B, a plurality of contacts CC are formed that penetrate through the insulating layers 52 and 51 and reach the upper surface of each word line WL in the stepped portion SP. These contacts CC are formed by forming a plurality of contact holes penetrating the insulating layers 52 and 51 to reach the word lines WL. An insulating layer 56 is formed to cover the sidewalls of the contact holes and conductive layer 22 is filled inside of the insulating layer 56.

As shown in FIGS. 10A and 10B, an insulating layer 53 is also formed on the insulating layer 52 covering the stacked body LM.

As shown in FIG. 10A, a plug CH is formed that penetrates through the insulating layer 53 and is connected to the channel layer CN of the pillar PL. Further, a bit line BL connected to the plug CH is formed on the insulating layer 53. Further, an insulating layer 54 covering the insulating layer 53 and the bit lines BL is formed, and a plurality of electrode pads PDb connected to the bit lines BL and exposed on the upper surface of the insulating layer 54 are formed in the insulating layer 54.

As shown in FIG. 10B, in the staircase region SR, in parallel with the process of FIG. 10A, plugs V0 that penetrate through the insulating layer 53 and are respectively connected to the plurality of contacts CC are formed. Although not shown, the plug V0 is also connected to the plate-like contact LI.

An upper layer wiring MX connected to the plug V0 is formed on the insulating layer 53. Further, an insulating layer 54 covering the insulating layer 53 and the upper layer wiring MX is formed, and a plurality of electrode pads PDb connected to the upper layer wiring MX and exposed on the upper surface of the insulating layer 54 are formed in the insulating layer 54.

Figure 11:
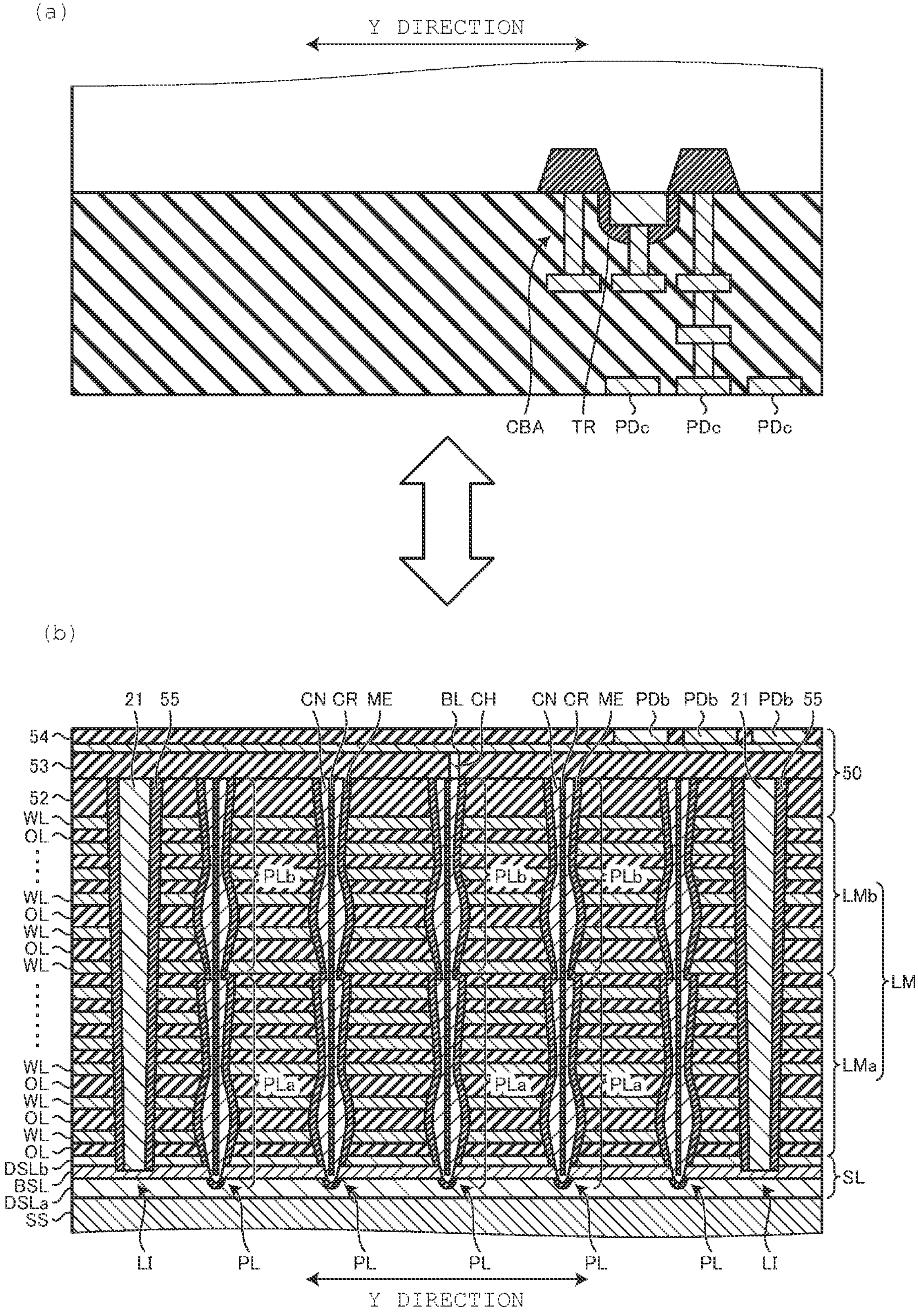
FIG. 11 is a diagram illustrating a part of the procedure of the manufacturing method of the semiconductor memory device according to Embodiment 1.

Next, FIG. 11 shows how the peripheral circuit CBA is formed on the stacked body LM. Part (a) in FIG. 11 shows a cross section of the semiconductor substrate SB on which the peripheral circuit CBA is formed. Part (b) in FIG. 11 shows a cross section of the memory region MR during manufacture, similar to FIGS. 9A and 9B and FIG. 10A.

As shown in part(a) in FIG. 11, a peripheral circuit CBA including a transistor TR is separately formed on the surface of a semiconductor substrate SB such as a silicon substrate. Further, an insulating layer 40 that covers the peripheral circuit CBA is formed. In the insulating layer 40, contacts, vias, and wirings connected to the peripheral circuit CBA are formed. Further, a plurality of electrode pads PDc are formed in the insulating layer 40 that is electrically connected to the peripheral circuit CBA through these components and are exposed on the surface of the insulating layer 40.

The surface of the semiconductor substrate SB on which the peripheral circuit CBA is formed in this way faces the surface of the supporting substrate SS on which the stacked body LM is formed as shown in part (b) of FIG. 11.

After that, the insulating layer 54 on the supporting substrate SS side and the insulating layer 40 on the semiconductor substrate SB side are bonded. These insulating layers 54 and 40 can be bonded by being activated in advance by plasma treatment, for example. When the insulating layers 54 and 40 are bonded, the supporting substrate SS and the semiconductor substrate SB are aligned such that the electrode pads PDb formed on the insulating layer 54 and the electrode pads PDc formed on the insulating layer 40 overlap each other.

After bonding the insulating layers 54 and 40, by performing annealing, the electrode pads PDb and PDc are bonded by Cu—Cu bonding, for example. As described above, a bonded substrate is obtained in which the supporting substrate SS and the semiconductor substrate SB are bonded together.

Thereafter, the supporting substrate SS is removed from the bonded substrate by chemical mechanical polishing (CMP) to expose the source line DSLa.

An insulating layer 60 is formed on the lower surface of the source line DSLa, and a plug PG (see FIGS. 1A and 1B) penetrating through the insulating layer 60 is formed. The electrode film 20 (see FIGS. 1A and 1B) is formed on the insulating layer 60. Thereby, the source line SL and the electrode film 20 are electrically connected via the plug PG.

A singulation process for cutting the semiconductor substrate SB by a dicing blade into individual semiconductor memory devices 1 is performed. In this case, the scribe lines provided on the outer periphery of the stacked body LM are substantially removed, but part of the scribe lines may remain as an outer peripheral region OR including the stacked body LMs separated from the stacked body LM, for example.

As described above, the semiconductor memory device 1 of Embodiment 1 is manufactured.

(Overview)

In a semiconductor memory device such as a three-dimensional non-volatile memory, a plurality of silicon nitride layers to be replaced with word lines later and a plurality of silicon oxide layers to insulate between a plurality of word lines are stacked, and a memory structure is formed in the memory holes penetrating through these layers.

As semiconductor memory devices become more highly integrated, the number of stacked layers of silicon nitride layers and silicon oxide layers is increasing, and it is desired to increase the throughput of forming memory holes by etching. Plasma etching using fluorocarbon gas and hydrogen gas at 0° C. or lower, instead of plasma etching under temperature conditions above 0° C., which has been used to form memory holes, can dramatically increase the etching rate of the silicon nitride layer.

On the other hand, under such low-temperature etching conditions, deposits generated during etching of the silicon nitride layer cause the memory hole to have a tapered shape, and the problem is that the memory structure formed in the memory hole cannot be sufficiently conducted to the source line in the lower layer.

The etching mechanism of memory holes in such low-temperature etching will be described with reference to FIGS. 12A to 12C.

Figures 12A, 12B, 12C:
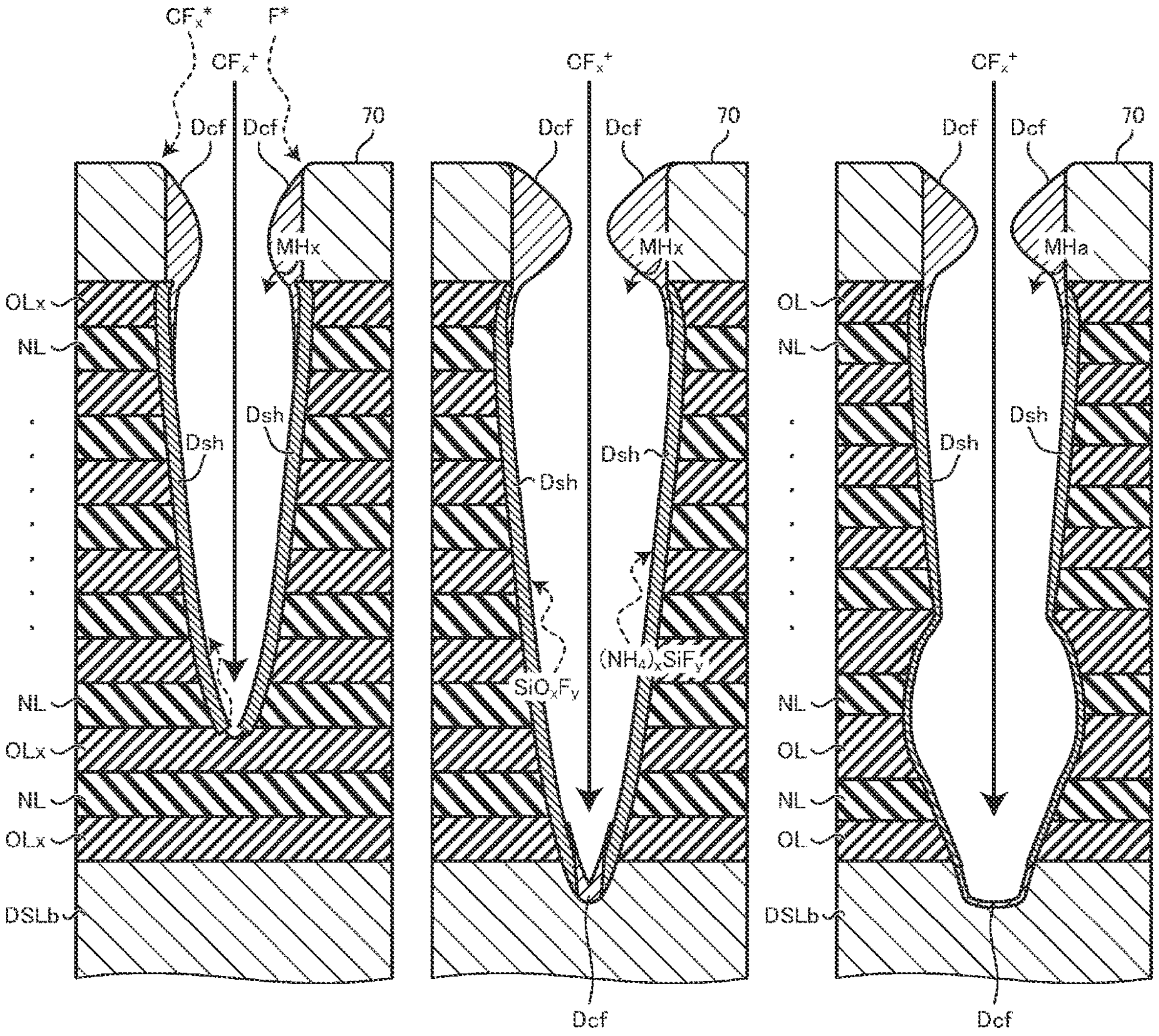
FIGS. 12A to 12C are schematic diagrams showing an etching mechanism for memory holes according to Embodiment 1 and a comparative example.

FIGS. 12A to 12C are schematic diagrams showing an etching mechanism of memory holes MHa and MHx according to Embodiment 1 and the comparative example. FIGS. 12A and 12B show how the memory holes MHx of the comparative example are formed by etching. FIG. 12C shows how the memory hole MHa of Embodiment 1 is formed by etching.

As shown in FIG. 12A, in the comparative example, all insulating layers OLx provided in the stacked body have the same thickness. By forming a resist layer 70 having a hole pattern on such a stacked body, and etching the stacked body through the resist layer 70 by plasma etching using, for example, a fluorocarbon-based gas and hydrogen gas at a low temperature, the memory hole MHx in the comparative example is formed.

In such an etching process, the memory holes MHx are formed by ion bombardment with fluorocarbon ions ($CFx^+$) while the deposits Dsh are deposited on the etched surfaces such as the side surfaces of the memory holes MHx. The materials of the deposits Dsh are reaction products of silicon and nitrogen (derived from the insulating layer NL), fluorine (derived from a fluorocarbon-based gas), and hydrogen (derived from a hydrogen gas), Deposits Dsh deposited on the side surfaces of memory holes MHx are formed containing, for example, $(NH_4)_xSiF_y$, $SiO_xF_y$, $NH_4F$, and HCN. Thus, the sidewall protection effect of the memory hole MHx by the deposit Dsh is enhanced, and the memory hole MHx, which had a bowing shape on the upper side, gradually becomes a tapered shape.

During such an etching process, the resist layer 70, which is used as an etching mask, is also partially etched (or eroded) by the etchants such as fluorocarbon radicals (CFx*) and fluorine radicals in fluorocarbons (F*).

Thus, deposits Dcf are a reaction product mixture of the carbon derived from the resist layer 70 and carbon and fluorine derived from a fluorocarbon-based gas. The deposits Dcf are deposited on the sidewalls of the hole pattern openings of the resist layer 70. Such deposits Dcf are generated containing CFx, for example.

As shown in FIG. 12B, after the memory hole MHx penetrates through the stacked body and reaches the source line DSLb in the lower layer, over-etching is further performed. When the memory hole MHx reaches the stacked body on the lower layer side, the memory hole MHx is further tapered, and the aspect ratio of the memory hole MHx is increased, making it difficult for fluorocarbon ions ($CFx^+$) to reach the bottom of the memory hole MHx. Therefore, the memory hole MHx has a further tapered shape.

Further, when the memory hole MHx reaches the source line DSLb, in order to obtain a selection ratio over the source line DSLb such that the source line DSLb is not etched, under the condition that CFx is likely to be deposited on the surface of the source line DSLb at the bottom of the memory hole MHx, the stage on which the support substrate is placed is switched to a high temperature, such as, for example, 50° C. or higher. In this case, a mixture containing CFx deposited on the surface of the source line DSLb at the bottom of the memory hole MHx and silicon derived from the source line DSLb will be sputtered by bombardment with fluorocarbon ions ($CFx^+$) and added as a component of the deposit Dsh.

Such deposits Dsh and deposits Dcf of CFx also help the memory hole MHx to have a tapered shape. When forming a memory hole penetrating through the stacked body in the upper layer, the memory hole in the lower layer filled with an amorphous silicon layer is over-etched. Therefore, the deposit Dsh containing silicon derived from the amorphous silicon layer and the deposit Dcf of CFx are also deposited on the bottom surface of the memory hole in the upper layer, so that the shape is considered to be tapered.

As shown in FIG. 12C, in the configuration of Embodiment 1, multiple insulating layers OLt are disposed on the lower layer side of the stacked body LMa. The memory hole MHx is likely to be tapered in this region. Thus, at the height positions of these insulating layers OLt, the amount of the deposit Dsh (deposition) generated from the insulating layer NL, which is, for example, a silicon nitride layer, is reduced, and it is possible to prevent the memory hole MHa from being overly tapered.

By adjusting the thickness and the number of the insulating layers OLt, it is also possible to form the memory holes MHa having bowing shapes at the height positions of these insulating layers OLt. Thus, by forming the memory hole MHa into a bowing shape on the lower side, the bottom area of the memory hole MHa can be effectively expanded.

Here, it is also conceivable to place an insulating layer OLt even as the lowermost layer of the stacked body LMa. However, the inventors found that the bottom area of the memory hole MHa is substantially determined by the layers above the lowermost insulating layer OL. It is presumed that this is because the deposits Dsh from the source line DSLb and the deposits Dcf such as CFx* are more likely to be deposited at the bottom of the memory hole MHa during over-etching.

Accordingly, with the height of the top surface of the stacked body LMa relative to the height of the bottom surface of the stacked body LMa being set as value of 100%, the bowing shape of the memory hole MHa can be easily obtained in a height position range of 20% to 50% of the total height, and such a bowing shape can increase the bottom area of the memory hole MHa.

According to the manufacturing method of the semiconductor memory device 1 of Embodiment 1, multiple insulating layers OLt, excluding the lowermost insulating layer OL of the stacked body LMa, are formed in the lower portion of the stacked body LMa to be thicker than the insulating layers OL nearer the upper layer side of the stacked body LMa. When forming the memory hole MHa, the stacked body LMa is etched while the deposits Dsh containing silicon and nitrogen are deposited on the sidewall of the memory hole MHa. Thereby, the memory hole MHa with a large bottom diameter can be formed under the condition of a high etching rate.

According to the manufacturing method of the semiconductor memory device 1 of Embodiment 1, with the height of the top surface relative to the height of the bottom surface of the stacked body LMa being 100%, some of the insulating layers OLt in the stacked body LMa are disposed in a height position of 20% or more and 50% or less.

In this way, by placing multiple insulating layers OLt at appropriate height positions until the memory hole MHa reaches the source line DSLb in the lower layer and over-etching starts, the memory hole MHa has a two-step bowing shape, so that it is possible to effectively expand the bottom diameter.

Modification Example

Next, a semiconductor memory device 1*a* according to a Modification Example of Embodiment 1 will be described with reference to FIG. 13. The semiconductor memory device 1*a* of the Modification Example differs from Embodiment 1 in that the insulating layers OLt and OLm, which are both thicker than the other insulating layers OL, have different thicknesses from each other.

Figure 13:
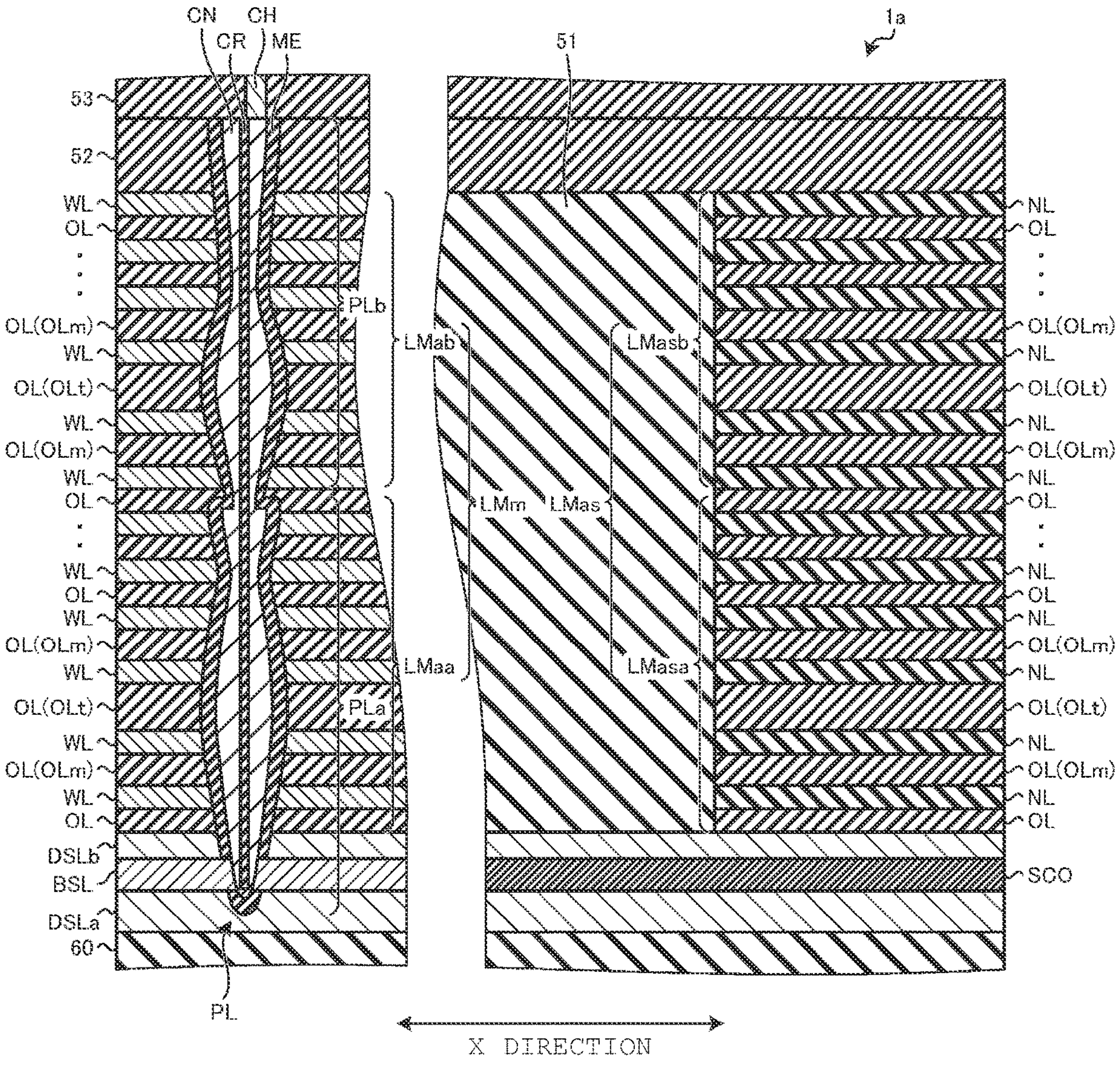
FIG. 13 is a cross-sectional view of a semiconductor memory device according to a Modification Example of Embodiment 1.

FIG. 13 is a cross-sectional view showing an example of the configuration of a semiconductor memory device 1*a* according to the Modification Example of Embodiment 1. FIG. 13 shows cross sections of the pillar PL disposed in the memory region MR and the unreplaced stacked body LMas disposed in the outer peripheral region OR.

As shown in FIG. 13, the semiconductor memory device 1*a* of this Modification Example includes a stacked body LMm including a stacked body LMaa as a first stacked body disposed on the source line SL and a stacked body LMab disposed on the stacked body LMaa.

The stacked body LMaa has a configuration in which the plurality of word lines WL and the plurality of insulating layers OL as a plurality of first insulating layers are alternately stacked one by one. Among the plurality of insulating layers OL, multiple insulating layers OLt and OLm, excluding the lowermost insulating layer OL of the stacked body LMaa, which are the insulating layers OL on the lower layer side of the stacked body LMaa, are thicker than the insulating layers OL on the upper layer side of the stacked body LMm. Moreover, among these insulating layers OLt and OLm, the insulating layer OLt is thicker than the insulating layer OLm.

More specifically, in the stacked body LMaa, with the height of the top surface relative to the height of the bottom surface of the stacked body LMaa being 100%, some of the insulating layers OLt and OLm are disposed in at least one of the height positions, within the range of 20% or more and 50% or less. Further, within the range where these insulating layers OLt and OLm are disposed, the insulating layer OLt is disposed near the center in the stacking direction of the stacked body LMaa. Further, the insulating layer OLm is disposed above and below the insulating layer OLt, respectively.

In the example of FIG. 13, two types of insulating layers OLt and OLm having two different layer thicknesses are shown. However, insulating layers OL (OLt, OLm, . . . ) thicker than other insulating layers OL may be three or more types of insulating layers OL having three or more different layer thicknesses.

In this way, the stacked body LMaa of this Modification Example is configured such that for the insulating layers OL (OLt, OLm, . . . ), the thicknesses of the insulating layers OL increase toward the central portion of the stacked body LMaa in the stacking direction.

The stacked body LMab has a configuration in which the plurality of word lines WL and the plurality of insulating layers OL are alternately stacked one by one. Among the plurality of insulating layers OL, excluding the lowermost insulating layer OL of the stacked body LMab, the insulating layers OLt and Olm, which on the lower layer side of the stacked body LMab, are thicker than the insulating layers OL on the upper layer side of the stacked body LMm. In this example, the insulating layers OLt are thicker than the insulating layers OLm.

More specifically, in the stacked body LMab, with the height of the top surface relative to the height of the bottom surface of the stacked body LMab being set to a value of 100%, some of the insulating layers OLt and OLm are disposed within the range of 20% to 50% of the full height. Further, within the range where these insulating layers OLt and OLm are disposed, the insulating layer OLt is disposed to be near the center in the stacking direction. Further, an insulating layer OLm is disposed above and below the insulating layer OLt.

In the example of FIG. 13, two types of insulating layers OLt and OLm having two different layer thicknesses are shown. However, insulating layers OL (OLt, OLm, . . . ) thicker than some of the other insulating layers OL may be three or more types of insulating layers OL having three or more different layer thicknesses.

In this way, the stacked body LMab of this Modification Example is configured such that the thicknesses of the insulating layers OL increase toward the central portion of the stacked body LMab in the stacking direction.

By configuring the stacked body LMm as described above, also in the semiconductor memory device 1*a* of the Modification Example, the pillar PLa disposed in the stacked body LMaa and the pillar PLb disposed in the stacked body LMab both have a two-step bowing shape.

That is, the pillar PLa has bowing shapes in both the upper part and the lower part, and the bowing shape in the lower part is disposed at the height position of the insulating layers OLt and OLm. Therefore, among the insulating layers OLt and OLm, the diameter and the cross-sectional area in the XY plane of the bowing shape in the lower part of the pillar PLa may be maximized at the height position of the insulating layer OLt in the central portion in the stacking direction of the stacked body LMaa.

Further, the pillar PLb has bowing shapes in the upper part and the lower part, respectively, and the bowing shape in the lower part is disposed at the height position of the insulating layers OLt and OLm. Therefore, the diameter and the cross-sectional area in the XY plane of the bowing shape in the lower part of the pillar PLb may be maximized at the height position of the insulating layer OLt nearer the central portion in the stacking direction of the stacked body LMab.

Thus, even when the insulating layers OLt and OLm are different in thickness from each other, the pillars PLa and PLb having a two-step bowing shape can be formed.

The stacked body LMas disposed in the outer peripheral region OR of the semiconductor memory device 1*a* maintains the state before the stacked body LMm undergoes the replacement process. Therefore, the stacked body LMas includes stacked bodies LMasa and LMasb in which a plurality of word lines WL and a plurality of insulating layers OL are alternately stacked one by one. Further, the stacked bodies LMasa and LMasb each have insulating layers OLt and OLm having different thicknesses from each other at positions corresponding to the insulating layers OLt and OLm of the stacked bodies LMaa and LMab.

According to the manufacturing method of the semiconductor memory device 1*a* of this Modification Example, the thicknesses of the insulating layers OLt and OLm increase toward the central portion of the stacked body LMaa in the stacking direction.

In this way, by making the insulating layers OLm above and below the insulating layer OLt slightly thinner than the insulating layer OLt, the total combined layer thickness of the insulating layers OLt and OLm can be made smaller than the corresponding total layer thickness of the insulating layers OLt in Embodiment 1. The insulating layer OLt, which is thicker than the insulating layer OLm, is disposed near the center of the height position where the bowing shape is likely to be obtained. Thus, the memory hole MHa having a two-step bowing shape can be formed while preventing a decrease in the etching rate.

Furthermore, by making the thicknesses of the insulating layers OLt and OLm different from each other and placing the thicker insulating layer OLt closer to the center in the stacking direction than the insulating layer OLm, the bowing shape in the lower part of the memory hole MHa can be more precisely controlled.

According to the manufacturing method of the semiconductor memory device 1*a* of this Modification Example, other effects similar to those of the manufacturing method of the semiconductor memory device 1 of Embodiment 1 described above can be obtained.

Embodiment 2

Embodiment 2 will be described below with reference to the drawings. Embodiment 2 differs from Embodiment 1 described above in that the ratio of oxygen contained in the insulating layer NL is increased.

Figure 14:
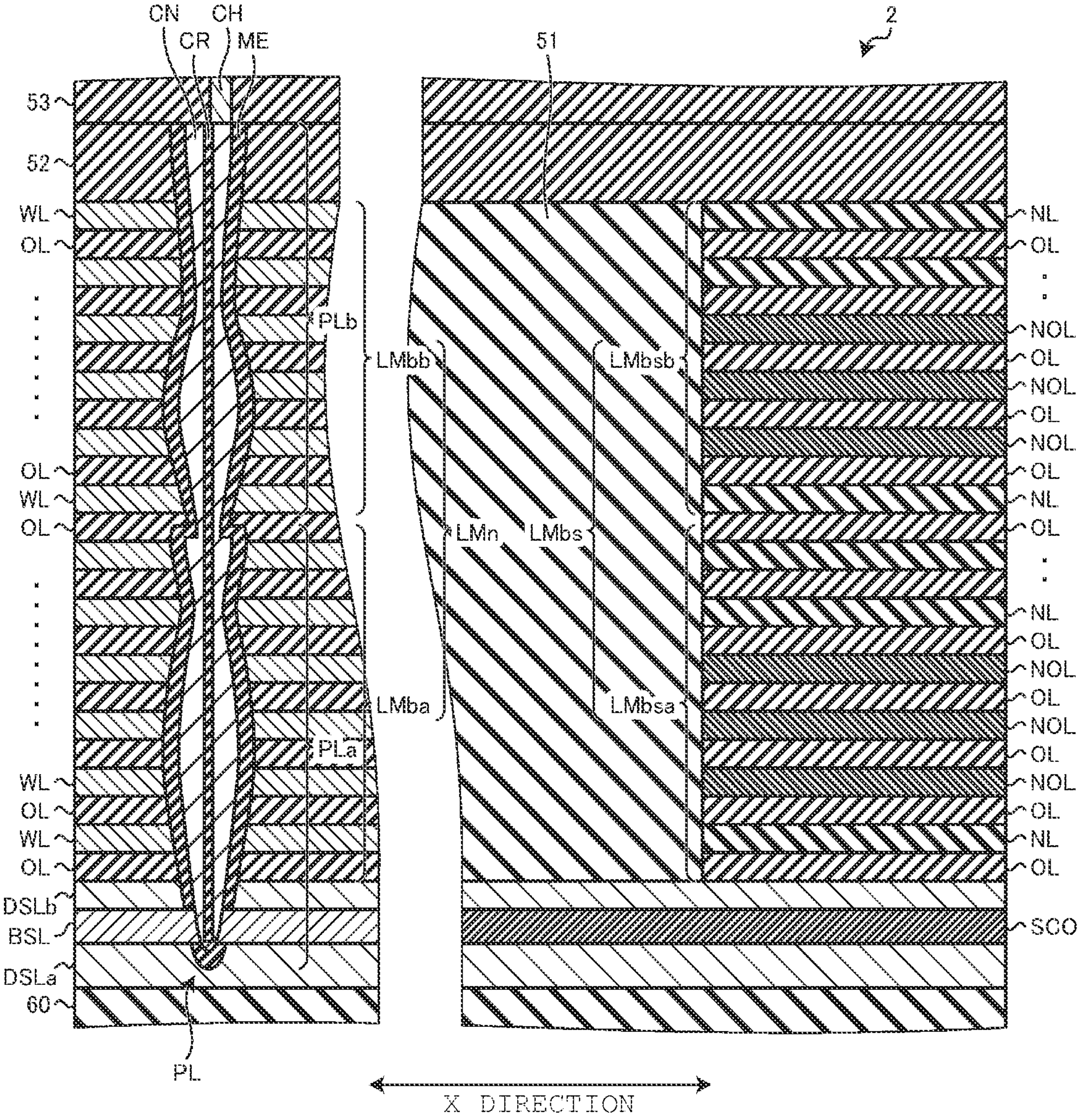
FIG. 14 is a cross-sectional view of a semiconductor memory device according to Embodiment 2.

FIG. 14 is a cross-sectional view showing an example of the configuration of a semiconductor memory device 2 according to Embodiment 2. FIG. 14 shows cross sections of the pillar PL disposed in the memory region MR and the unreplaced stacked body LMbs disposed in the outer peripheral region OR.

As shown in FIG. 14, the semiconductor memory device 2 of Embodiment 2 includes a stacked body LMn including a stacked body LMba as a first stacked body disposed on the source line SL and a stacked body LMbb as a third stacked body disposed on the stacked body LMba.

The stacked body LMba has a configuration in which word lines WL as a plurality of first conductive layers and insulating layers OL as a plurality of first insulating layers are alternately stacked one by one. The plurality of insulating layers OL of the stacked body LMba all have substantially the same thickness.

The stacked body LMbb has a configuration in which word lines WL as a plurality of second conductive layers and insulating layers OL as a plurality of third insulating layers are alternately stacked one by one. The plurality of insulating layers OL of the stacked body LMbb all have substantially the same thickness.

Further, the stacked body LMbs disposed in the outer peripheral region OR of the semiconductor memory device 2 includes a stacked body LMbsa disposed on the source line SL and a stacked body LMbsb disposed on the stacked body LMbsa. Further, the insulating layers OL as the plurality of second insulating layers provided in the stacked bodies LMbsa and LMbsb all have substantially the same thickness, like the stacked bodies LMba and LMbb described above.

However, the stacked body LMbsa includes insulating layers NL (as first insulating layers which are silicon nitride layers) and insulating layers NOL (as first insulating layers containing oxygen at a higher ratio than the insulating layer NL) on the upper layer side of the stacked body bsa instead of insulating layers NL excluding the lowermost insulating layer NL of the stacked body LMbsa.

More specifically, the insulating layer NOL is, for example, a silicon oxynitride layer, and has a layer thickness substantially equal to that of the other insulating layers NL. More specifically, with the height of the top surface relative to the height of the bottom surface of the stacked body LMbsa being set as value of 100%, the insulating layers NOL in the stacked body LMba are disposed in at height positions within the range of 20% to 50% of the full height.

The insulating layer NOL, which is a silicon oxynitride layer, is formed using plasma CVD method, for example, by adding an oxidizing gas such as an oxygen ($O_2$) gas, in addition to a silane-based gas such as monosilane ($SiH_4$) and a nitriding gas such as ammonia ($NH_3$) gas.

Similarly, a stacked body LMbsb (as a fourth stacked body) includes insulating layers NL as a plurality of fourth insulating layers and insulating layers NOL as fourth insulating layers containing oxygen at a higher ratio than the insulating layer NL on the upper layer side of the stacked body bsb, instead of insulating layers NL excluding the lowermost insulating layer NL of the stacked body LMbsb.

More specifically, with the height of the top surface relative to the height of the bottom surface of the stacked body LMbsb being set as a value of 100%, the insulating layers NOL in the stacked body LMbsb are disposed in at height positions within the range of 20% to 50% of the full height.

Here, the stacked body LMbs indicates the state before the stacked body LMn undergoes the replacement process. Since the stacked body LMn before the replacement process includes insulating layers NOLs containing oxygen on the lower layer side, when the memory holes MHa and MHb are formed by low-temperature plasma etching, the amount of the deposits Dsh generated from the insulating layers NOL decreases compared to the amount of deposits Dsh generated from the other insulating layers NL.

Therefore, also in the semiconductor memory device 2 of Embodiment 2, the pillar PLa disposed in the stacked body LMba and the pillar PLb disposed in the stacked body LMbb both have a two-step bowing shape.

That is, the pillar PLa has bowing shapes as a first bowing shape and a second bowing shape in the lower part and the upper part, respectively, and the bowing shape in the lower part is disposed at the height position of the insulating layer NOL. Further, the pillar PLb has bowing shapes as a third bowing shape and a fourth bowing shape in the lower part and the upper part, respectively, and the bowing shape in the lower part is disposed at the height position of the insulating layer NOL.

In this way, even when the insulating layer NOL, which is a silicon oxynitride layer, is disposed at an appropriate position of the stacked body LMbs, the pillars PLa and PLb having a two-step bowing shape can be formed.

In this case, by adjusting the degree of oxidation and the number of layers of the insulating layer NOL provided in the stacked body LMbs, the bowing shape formed on each of the pillars PLa and PLb is also adjusted, and the diameter and area of the bottom surfaces of the pillars PLa and PLb can be expanded to the desired size.

More preferably, the composition of the insulating layer NOL can be adjusted to have a ratio of, for example, silicon of 30 atm % or more and 45 atm % or less, nitrogen of 35 atm % or more and 55 atm % or less, hydrogen of 20 atm % or more and 30 atm % or less, and oxygen of 10 atm % or more and 20 atm % or less.

According to the manufacturing method of the semiconductor memory device 2 of Embodiment 2, insulating layers NOL near the lower layer side of the stacked body LMbsa, excluding the lowermost insulating layer NL of the stacked body LMbsa, contain oxygen at a higher ratio than the insulating layers NL on the upper layer side of the stacked body bsa, and when forming the memory hole MHa, the stacked body LMa is etched while the deposits Dsh containing silicon and nitrogen are deposited on the sidewall of the memory hole MHa. Thereby, the memory hole MHa with a large bottom diameter can be formed under the condition of a high etching rate.

According to the manufacturing method of the semiconductor memory device 2 of Embodiment 2, with the height of the top surface relative to the height of the bottom surface of the stacked body LMbsa being set to a value of 100% at least some of the insulating layers NOL in the stacked body LMbsa are formed in a height position of 20% to 50% of the full height.

In this way, by placing insulating layers NOL at appropriate height positions before the memory hole MHa reaches the source line DSLb in the lower layer and over-etching starts, the memory hole MHa has a two-step bowing shape, so that it is possible to effectively expand the bottom diameter.

According to the manufacturing method of the semiconductor memory device 2 of Embodiment 2, insulating layers NOL are formed such that each contains 30 atm % to 45 atm % of silicon, 35 atm % to 55 atm % of nitrogen, and 10 atm % to 20 atm % of oxygen.

Thus, by properly adjusting the ratio of nitrogen and oxygen contained in the insulating layers NOL, a memory hole MHa having a desired bottom diameter and bottom area can be formed.

According to the manufacturing method of the semiconductor memory device 2 of Embodiment 2, other effects similar to those of the manufacturing method of the semiconductor memory device 1 of Embodiment 1 described above are obtained.

Modification Example

Next, a semiconductor memory device 2*a* according to a Modification Example of Embodiment 2 will be described with reference to FIG. 15. The semiconductor memory device 2*a* of the Modification Example differs from Embodiment 2 in that the insulating layers NOL and NOLc have different oxygen ratios.

Figure 15:
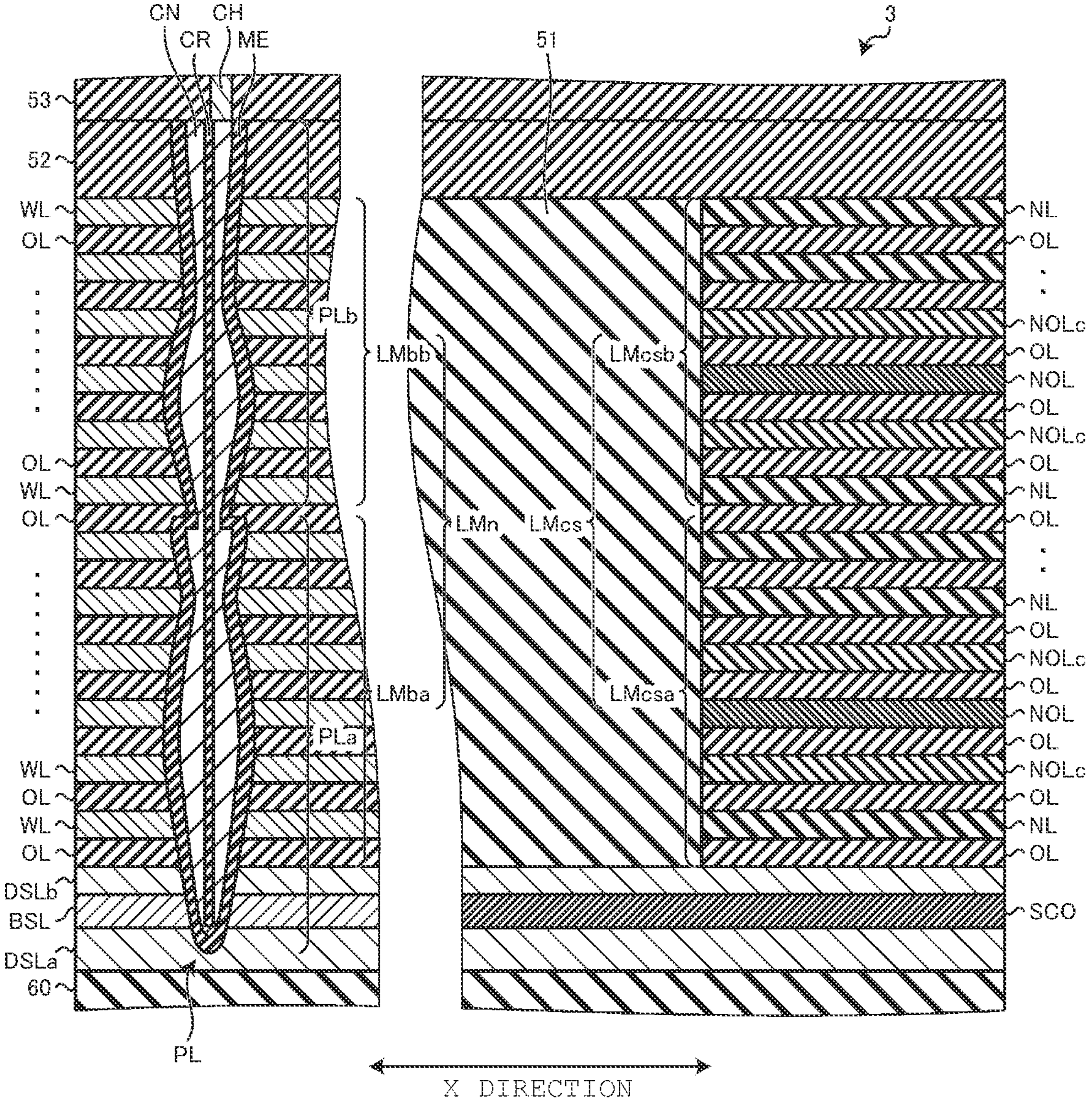
FIG. 15 is a cross-sectional view of a semiconductor memory device according to a Modification Example of Embodiment 2.

FIG. 15 is a cross-sectional view showing an example of the configuration of the semiconductor memory device 2*a* according to this Modification Example of Embodiment 2. FIG. 15 shows cross sections of the pillar PL disposed in the memory region MR and the unreplaced stacked body LMcs disposed in the outer peripheral region OR.

As shown in FIG. 15, the semiconductor memory device 2*a* of this Modification Example also includes a stacked body LMn in which all insulating layers OL have substantially the same thickness, as in Embodiment 2. The same applies to a stacked body LMcs disposed in the outer peripheral region OR and including a stacked body LMcsa disposed on source line SL and a stacked body LMcsb disposed on the stacked body LMcsa.

However, in the stacked body LMcsa, some of the insulating layers NOL of the stacked body LMbsa of Embodiment 2 become insulating layers NOLc, which are silicon oxynitride layers having a lower oxygen ratio than the insulating layer NOL. More specifically, among the insulating layers NOL and NOLc, which are both silicon oxynitride layers, the degree of oxidation of the insulating layer NOLc is lower than the degree of oxidation of the insulating layer NOL.

More specifically, the insulating layers NOL and NOLc each have a layer thickness substantially equal to the layer thickness of the other insulating layers NL, and in the stacked body LMcsa, with the height of the top surface relative to the height of the bottom surface of the stacked body LMcsa being set to a value of 100%, the insulating layers NOL and NOLc are disposed in at height positions within the range of 20% to 50% of the full height.

Even in this case, the composition of each of the insulating layers NOL and NOLc can be adjusted to have a ratio of, for example, silicon of 30 atm % to 45 atm %, nitrogen of 35 atm % to 55 atm %, hydrogen of 20 atm % to 30 atm %, and oxygen of 10 atm % to 20 atm %, while making the oxygen ratios of the insulating layers NOL and NOLc different.

Further, within the range where these insulating layers NOL and NOLc are disposed, the highly oxidized insulating layer NOL is disposed nearer the center in the stacking direction of the stacked body LMcsa. The insulating layers NOLc having a low degree of oxidation are disposed above and below the insulating layer NOL.

Similarly, in the stacked body LMcsb, some of the insulating layers NOL of the stacked body LMbsb of Embodiment 2 can be an insulating layer NOLc, which is a silicon oxynitride layer having a lower oxygen ratio than the insulating layer NOL.

More specifically, with the height of the top surface relative to the height of the bottom surface of the stacked body LMcsb being set as a value of 100%, some of the insulating layers NOL and NOLc in the stacked body LMcsb are disposed in at height positions within the range of 20% to 50% of full height. Further, within the range where these insulating layers NOL and NOLc are disposed, the insulating layer NOL having a higher degree of oxidation is disposed near the center in the stacking direction of the stacked body LMcsb. The insulating layers NOLc having a lower degree of oxidation are disposed above and below the insulating layer NOL.

It should be noted that although the example of FIG. 15 shows two types of insulating layers NOL and NOLc having two different oxygen ratios in the stacked bodies LMcsa and LMcsb, the insulating layers NOL containing oxygen may be three or more types of insulating layers NOL having three or more different oxygen ratios.

In this way, each of the stacked bodies LMcsa and LMcsb of this Modification Example is configured such that the oxygen ratio of the insulating layers NOL increases toward the central portion of each of the stacked bodies LMcsa and LMcsb in the stacking direction for at least some insulating layers NOL (NOL, NOLc, . . . ).

Here, the stacked body LMcs refers to the state before the stacked body LMn undergoes the replacement process. When the memory holes MHa and MHb are formed by low-temperature plasma etching, the memory holes Mha and MHb having a two-step bowing shape are obtained, even by configuring the stacked body LMn before the replacement process to include the insulating layers NOL and NOLc having different oxygen ratios on the lower layer side.

That is, the pillar Pla disposed in the stacked body Lmba has bowing shapes in the lower part and the upper part, respectively, and the bowing shape in the lower part is disposed at the height position of the insulating layers NOL and NOLc. Further, among the insulating layers NOL and NOLc, the diameter and the cross-sectional area in the XY plane of the bowing shape in the lower part of the pillar Pla may be maximized, at the height position of the insulating layer NOL in the central portion in the stacking direction of the stacked body Lmba.

Similarly, the pillar PLb disposed in the stacked body LMbb has bowing shapes in the lower part and the upper part, respectively, and the bowing shape in the lower part is disposed at the height position of the insulating layers NOL and NOLc. Further, among the insulating layers NOL and NOLc, the diameter and the cross-sectional area in the XY plane of the bowing shape in the lower part of the pillar PLb may be maximized, at the height position of the insulating layer NOL in the central portion in the stacking direction of the stacked body LMbb.

According to the manufacturing method of the semiconductor memory device 2*a* of this Modification Example, in the stacking direction of the stacked body LMcsa, insulating layers NOL and NOLc are formed such that the ratio of oxygen increases toward the central portion of the stacked body LMcsa in the stacking direction.

The insulating layer NOL containing oxygen at a high ratio has a lower etching rate in low-temperature plasma etching than the insulating layer NL which is a silicon nitride layer. On the other hand, as described above, with the height of the top surface of the stacked body LMcsa relative to the height of the bottom surface of the stacked body LMcsa being set to a value of 100%, it has been found that the bowing shape of the memory hole MHa is likely to be obtained at a height position of about 20% to 50% of the full height.

Therefore, by placing the insulating layer NOL having a high oxygen ratio near the center of the height position where the bowing shape is likely to be obtained, and lowering the oxygen ratio of the insulating layers NOLc disposed above and below the insulating layer NOL, the memory hole MHa having a two-step bowing shape can be formed while preventing a decrease in the etching rate.

Furthermore, by making the oxygen ratios of the insulating layers NOL and NOLc different from each other and placing the insulating layer NOL having a higher oxygen ratio closer to the center in the stacking direction than the insulating layer NOLc, the bowing shape in the lower part of the memory hole MHa can be more precisely controlled.

According to the manufacturing method of the semiconductor memory device 2*a* of this Modification Example, other effects similar to those of the manufacturing method of the semiconductor memory device 2 of Embodiment 2 described above are obtained.

Embodiment 3

Embodiment 3 will be described below with reference to the drawings. Embodiment 3 is different from Embodiment 2 in that one insulating layer NOL is configured with a different type of layer.

It is possible to increase the ratio of oxygen in some insulating layers NL by forming a stacked structure of insulating layers NL and insulating layers NOL instead of replacing some insulating layers NL with insulating layers NOL such as silicon oxynitride layers as in Embodiment 2.

Figure 16:
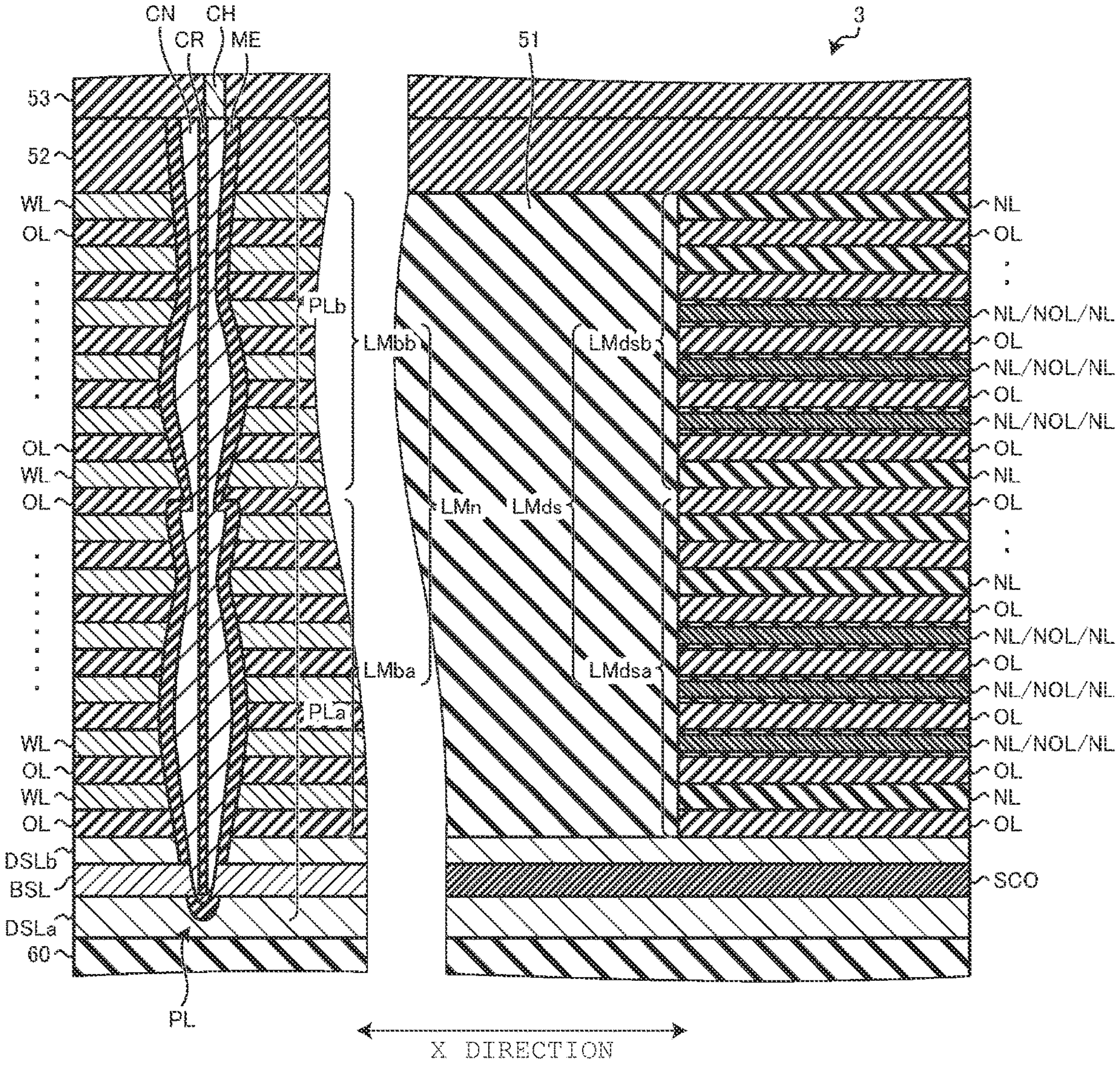
FIG. 16 is a cross-sectional view of a semiconductor memory device according to Embodiment 3.

FIG. 16 is a cross-sectional view showing an example of the configuration of a semiconductor memory device 3 according to Embodiment 3. FIG. 16 shows cross sections of the pillar PL disposed in the memory region MR and the unreplaced stacked body LMds disposed in the outer peripheral region OR.

As shown in FIG. 16, the semiconductor memory device 3 of Embodiment 3 also includes a stacked body LMn in which all insulating layers OL have substantially the same thickness, as in Embodiment 2. The same applies to a stacked body LMds disposed in the outer peripheral region OR and including a stacked body LMdsa disposed on the source line SL and a stacked body LMdsb disposed on the stacked body LMdsa.

However, the stacked body LMdsa includes groups of insulating layers NL/NOL/NL in which different types of layers are stacked on each other, instead of the just insulating layers NOL as in the stacked body LMbsa of Embodiment 2. In other words, each of the group of insulating layers NL/NOL/NL has a configuration in which an insulating layer NL is stacked with an insulating layer NOL, though the grouped layer may have substantially the same layer thickness as the single insulating layers NL used in other parts of the stacked body LMbsa.

More specifically, each of the insulating layers NL/NOL/NL has an insulating layer NOL disposed in the middle of two insulating layers NL disposed directly above and below the insulating layer NOL.

More specifically, with the height of the top surface relative to the height of the bottom surface of the stacked body LMcsa being set as a value of 100%, insulating layers NL/NOL/NL in the stacked body LMcsa are disposed in at height positions within the range of 20% to 50%.

Similarly, the stacked body LMdsb includes grouped insulating layers NL/NOL/NL instead of insulating layers NOL as in the stacked body LMbsb of Embodiment 2. More specifically, with the height of the top surface relative to the height of the bottom surface of the stacked body LMcsa being set as a value 100%, grouped insulating layers NL/NOL/NL in the stacked body LMcsa are disposed in height positions within the range of 20% to 50% of the full height.

Here, the stacked body LMds indicates the state before the stacked body LMn undergoes the replacement process. When the memory holes MHa and MHb are formed by low-temperature plasma etching, the memory holes MHa and MHb having a two-step bowing shape can be obtained when stacked body LMn includes grouped insulating layers NL/NOL/NL on the lower layer side.

That is, the pillar PLa disposed in the stacked body LMba has bowing shapes in the lower part and the upper part, respectively, and the bowing shape in the lower part is disposed at the height position of the grouped insulating layers NL/NOL/NL. Similarly, the pillar PLb disposed in the stacked body LMbb has bowing shapes in the lower part and the upper part, respectively, and the bowing shape in the lower part is disposed at the height position of the grouped insulating layers NL/NOL/NL.

In this case, by adjusting the layer thickness of each of the insulating layers NL and NOL provided in the grouped insulating layers NL/NOL/NL and the oxygen ratio of the insulating layer NOL, the bowing shape formed on each of the pillars PLa and PLb can also be adjusted, and the diameter and area of the bottom surfaces of the pillars PLa and PLb can be expanded to the desired size.

In this case, the composition of the insulating layer NOL also can be adjusted to have a ratio of, for example, silicon of 30 atm % to 45 atm %, nitrogen of 35 atm % to 55 atm %, hydrogen of 20 atm % to 30 atm %, and oxygen of 10 atm % to 20 atm %.

According to the manufacturing method of the semiconductor memory device 3 of Embodiment 3, grouped insulating layers NL/NOL/NL are formed, and when forming the memory hole MHa, the stacked body LMa is etched while deposits Dsh containing silicon and nitrogen are deposited on the sidewall of the memory hole MHa. Thereby, the memory hole MHa with a large bottom diameter can be formed under the condition of a high etching rate.

According to the manufacturing method of the semiconductor memory device 3 of Embodiment 3, grouped insulating layers NL/NOL/NL have an insulating layer NOL and with a pair of insulating layers NL sandwiching the insulating layer NOL.

Thus, the total layer thickness of the insulating layers NOL provided in the insulating layers NL/NOL/NL can be made smaller than the total layer thickness of the insulating layers NOL in Embodiment 2. Therefore, it is possible to form the memory hole MHa with a high throughput, while preventing an increase in the layer thickness of the insulating layer NOL having a lower etching rate than the insulating layer NL.

According to the manufacturing method of the semiconductor memory device 3 of Embodiment 3, other effects similar to those of the manufacturing method of the semiconductor memory devices 1 and 2 of Embodiments 1 and 2 described above are obtained.

Modification Example 1

Next, a semiconductor memory device **3*a* according to a Modification Example 1 of Embodiment 3 will be described with reference to FIG. 17. The semiconductor memory device 3*a*** of the Modification Example 1 differs from Embodiment 3 in that the insulating layers NOL and NOLe inserted in the insulating layers NL/NOL/NL and NL/NOLe/NL have different layer thicknesses.

Figure 17:
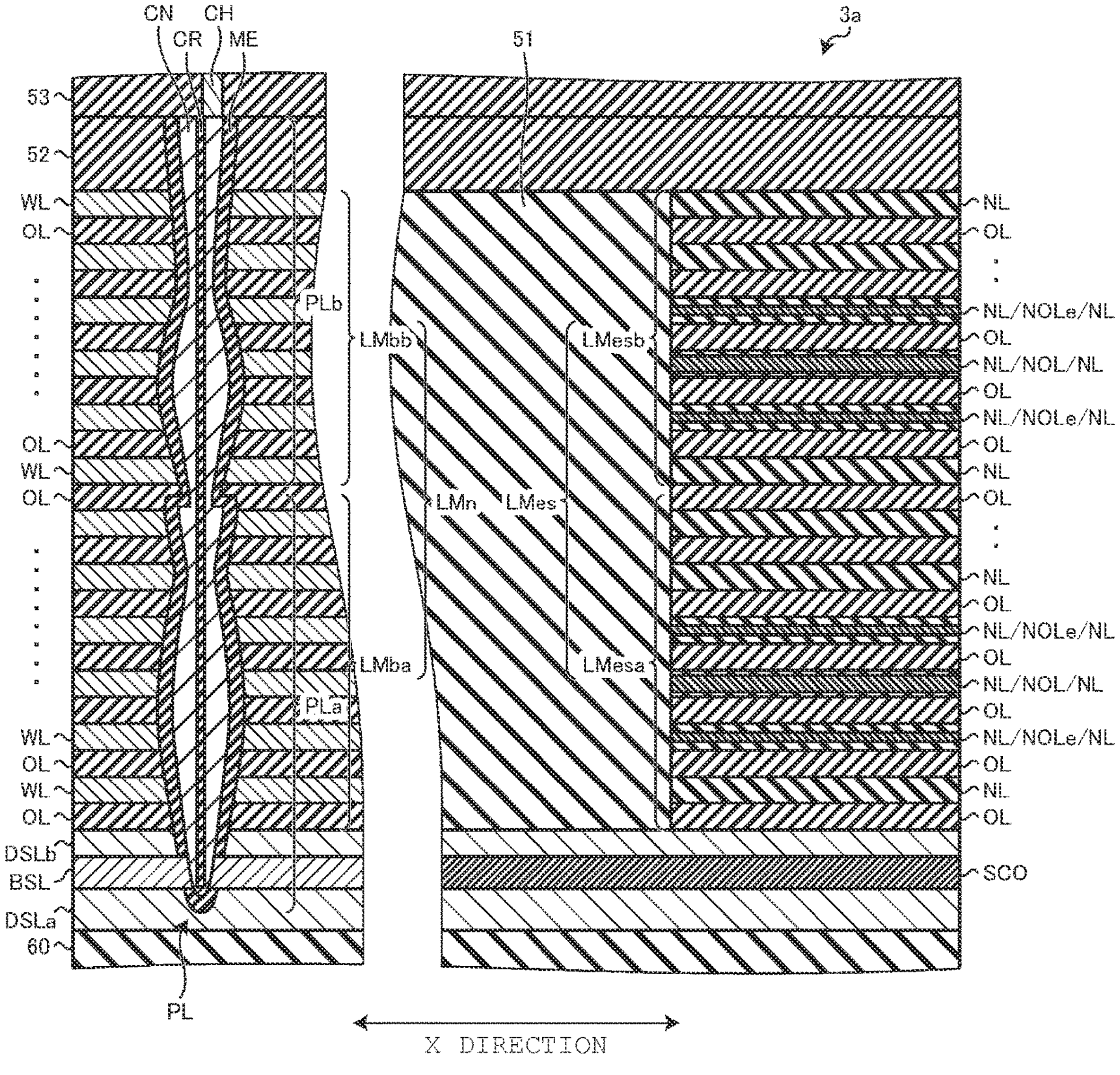
FIG. 17 is a cross-sectional view of a semiconductor memory device according to a Modification Example 1 of Embodiment 3.

FIG. 17 is a cross-sectional view showing an example of the configuration of the semiconductor memory device **3*a* according to this Modification Example 1 of Embodiment 3. FIG. 17** shows cross sections of the pillar PL disposed in the memory region MR and the unreplaced stacked body LMes disposed in the outer peripheral region OR.

As shown in FIG. 17, the semiconductor memory device **3*a*** of this Modification Example 1 also includes a stacked body LMn in which all insulating layers OL have substantially the same thickness, as in Embodiment 3. The same applies to a stacked body LMes disposed in the outer peripheral region OR and including a stacked body LMesa disposed on the source line SL and a stacked body LMesb disposed on the stacked body LMesa.

However, in the stacked body LMesa, insulating layer NOLe provided in the grouped insulating layers NL/NOLe/NL is thinner than the insulating layer NOL provided in the grouped insulating layers NL/NOL/NL. Furthermore, the insulating layers NL provided in the grouped insulating layers NL/NOLe/NL can be thicker than the insulating layers NL provided in the grouped insulating layers NL/NOL/NL.

That is, each of the grouped insulating layers NL/NOL/NL and grouped insulating layers NL/NOLe/NL have a layer thickness that is substantially equal to the layer thickness of the other (non-grouped) insulating layers NL, and the thickness ratio between the insulating layer NOL and the insulating layer NL provided in the grouped insulating layers NL/NOL/NL and the layer thickness ratio between the insulating layer NOLe and the insulating layer NL provided in the grouped insulating layer NL/NOLe/NL can be different.

In this case, the composition of each of the insulating layers NOL and NOLe also can be adjusted to have a ratio of, for example, silicon of 30 atm % to 45 atm %, nitrogen of 35 atm % to 55 atm %, hydrogen of 20 atm % to 30 atm %, and oxygen of 10 atm % to 20 atm %.

Thus, the stacked body LMesa of this Modification Example 1 is configured such that the layer thickness of the insulating layer NOL to in the grouped insulating layers NL/NOL/NL (NL/NOL/NL, NL/NOLe/NL, . . . ) increases and the layer thickness of the insulating layers NL sandwiching the insulating layer NOL from above and below decreases as the grouped layers get closer to the central portion in the stacking direction of the stacked body LMesa.

Similarly, in the stacked body LMesb, the insulating layer NOLe provided in the grouped insulating layers NL/NOLe/NL is thinner than the insulating layer NOL provided in the grouped insulating layers NL/NOL/NL. Further, the insulating layer NL provided in the grouped insulating layers NL/NOLe/NL is thicker than the insulating layer NL provided in the grouped insulating layers NL/NOL/NL.

It should be noted that although the example of FIG. 17 shows two types of insulating layers NL/NOL/NL and NL/NOLe/NL having two different layer thickness ratios provided in each of the stacked bodies LMesa and LMesb, three or more types of insulating layers NL/NOL/NL in which the insulating layer NOL to be inserted has three or more different layer thickness ratios may be used.

Thus, the stacked bodies LMesa and LMesb of this Modification Example 1 can be configured such that, in grouped insulating layers NL/NOL/NL (NL/NOL/NL, NL/NOLe/NL, . . . ), the layer thickness of the insulating layer NOL to be inserted increases and the layer thickness of the insulating layers NL sandwiching the insulating layer NOL decreases as the grouped layers get closer to the central portion of the stacked bodies LMesa and LMesb in the stacking direction.

Here, the stacked body LMes indicates the state before the stacked body LMn undergoes the replacement process. When the memory holes MHa and MHb are formed by low-temperature plasma etching, the memory holes MHa and MHb having a two-step bowing shape are obtained, even by configuring the stacked body LMn before the replacement process to include insulating layers NL/NOL/NL and NL/NOLe/NL.

That is, the pillar PLa disposed in the stacked body LMba has bowing shapes in the lower part and the upper part, respectively, and the bowing shape in the lower part is disposed at the height positions of the insulating layers NL/NOL/NL and NL/NOLe/NL. Among the insulating layers NL/NOL/NL and NL/NOLe/NL, the diameter and the cross-sectional area in the XY plane of the bowing shape in the lower part of the pillar PLa are maximized at the height position of the insulating layers NL/NOL/NL.

Similarly, the pillar PLb disposed in the stacked body LMbb has bowing shapes in the lower part and the upper part, respectively, and the bowing shape in the lower part is disposed at the height positions of the insulating layers NL/NOL/NL and NL/NOLe/NL. Among the insulating layers NL/NOL/NL and NL/NOLe/NL, the diameter and the cross-sectional area in the XY plane of the bowing shape in the lower part of the pillar PLb are maximized at the height position of the insulating layers NL/NOL/NL.

According to the semiconductor memory device 3*a* of this Modification Example 1, in grouped insulating layers NL/NOL/NL and NL/NOLe/N located in the stacked body LMesa, grouped insulating layers NL/NOL/NL and NL/NOLe/N are formed such that the thickness of the respective insulating layer NOL in the grouped layer gets larger as the grouped layer gets closer to the central portion in the stacking direction.

As such, the memory hole MHa having a two-step bowing shape can still be formed while preventing a decrease in the etching rate, as in the Modification Example of Embodiment 2.

Furthermore, by making the layer thicknesses of the insulating layers NOL and NOLe inserted in the grouped insulating layers NL/NOL/NL and NL/NOLe/NL respectively different, and disposing the thicker insulating layers NOL to be closer to the center in the stacking direction than the insulating layer NOLe, the bowing shape in the lower part of the memory hole MHa can be more precisely controlled.

According to the manufacturing method of the semiconductor memory device 3*a* of this Modification Example 1, other effects similar to those of the manufacturing method of the semiconductor memory device 3 of Embodiment 3 are obtained.

Modification Example 2

Next, a semiconductor memory device 3*b* according to a Modification Example 2 of Embodiment 3 will be described with reference to FIG. 18. The semiconductor memory device 3*b* of this Modification Example 2 differs from Embodiment 3 in having an insulating layer NOLm in which a plurality of insulating layers NL and a plurality of insulating layers NOL are stacked.

Figure 18:
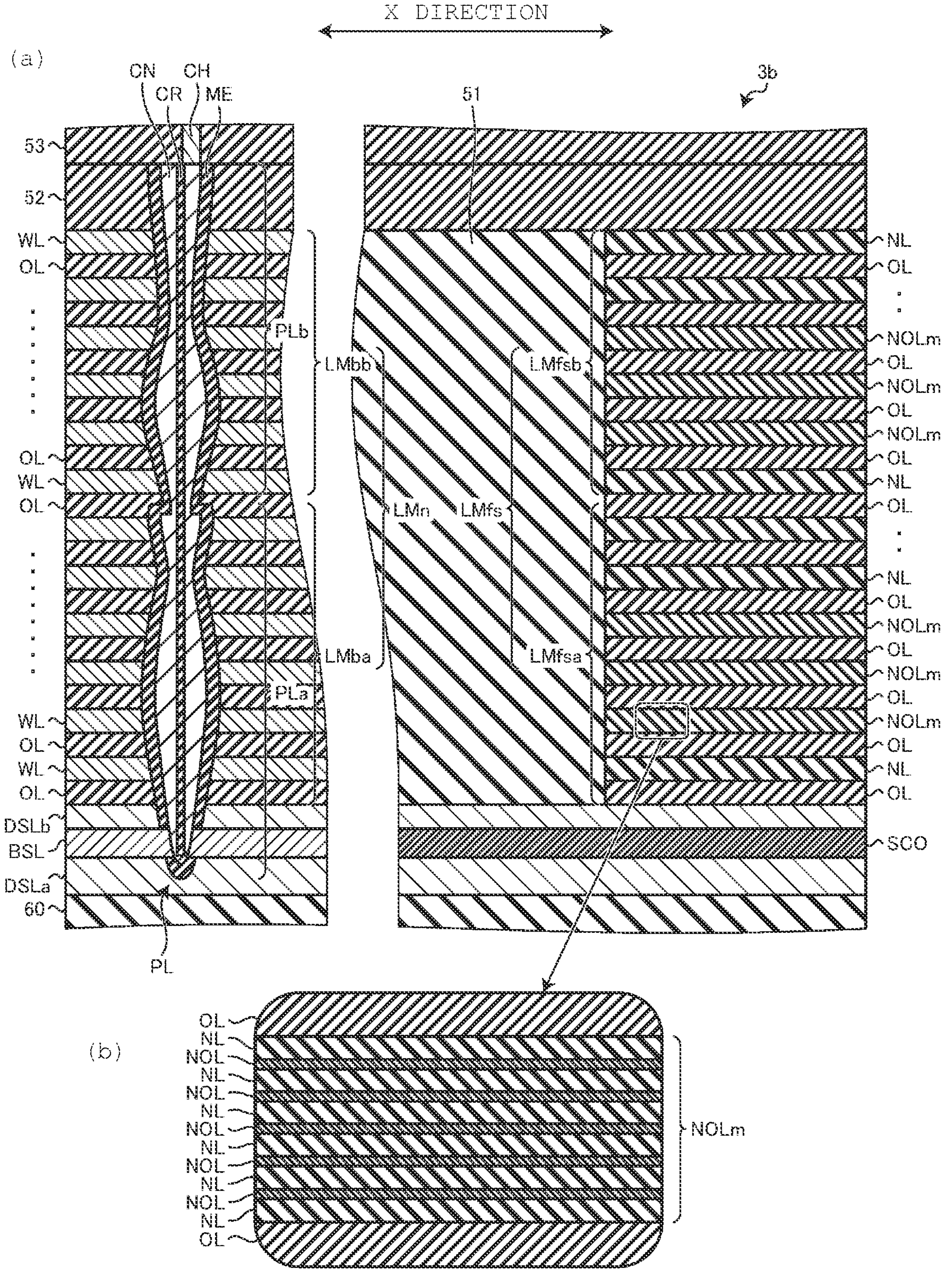
FIG. 18 is a cross-sectional view of a semiconductor memory device according to a Modification Example 2 of Embodiment 3.

FIG. 18 is a cross-sectional view showing an example of the configuration of the semiconductor memory device 3*b* according to this Modification Example 2 of Embodiment 3. Portion (a) in FIG. 18 shows cross sections of the pillar PL disposed in the memory region MR and the unreplaced stacked body LMfs disposed in the outer peripheral region OR. Portion (b) in FIG. 18 shows a partially enlarged view of the insulating layer NOLm provided in the stacked body LMfs.

As shown in FIG. 18, the semiconductor memory device 3*b* of this Modification Example 2 also includes a stacked body LMn in which all insulating layers OL have substantially the same thickness, as in Embodiment 3. The same applies to a stacked body LMfs disposed in the outer peripheral region OR and including a stacked body LMfsa disposed on the source line SL and a stacked body LMfsb disposed on the stacked body LMfsa.

However, the stacked body LMfsa has insulating layers NOLm instead of the grouped insulating layers NL/NOL/NL of the stacked body LMdsa of Embodiment 3. Similarly, the stacked body LMfsb has insulating layers NOLm instead of the grouped insulating layers NL/NOL/NL of the stacked body LMdsb of Embodiment 3.

Each of these insulating layers NOLm has a configuration in which insulating layers NL and insulating layers NOL are alternately stacked one by one. Insulating layers NL are disposed above and below the insulating layers NOLm in the stack.

The insulating layers NOLm each have a stacked (multi-layer) structure that can be formed using plasma CVD method, for example, by intermittently adding an oxidizing gas such as an oxygen ($O_2$) gas to a silane-based gas such as monosilane ($SiH_4$) and a nitriding gas such as ammonia ($NH_3$) gas.

Here, the stacked body LMfs indicates the state before the stacked body LMn undergoes the replacement process. When the memory holes MHa and MHb are formed by low-temperature plasma etching, the memory holes MHa and MHb having a two-step bowing shape are obtained, even by configuring the stacked body LMn before the replacement process to include several insulating layers NOLm.

That is, the pillar PLa disposed in the stacked body LMba has bowing shapes in the upper part and the lower part, and the bowing shape in the lower part is disposed at the height position of an insulating layer NOLm. Similarly, the pillar PLb disposed in the stacked body LMbb has bowing shapes in the upper part and the lower part, and the bowing shape in the lower part is disposed at a height position of an insulating layer NOLm.

According to the manufacturing method of the semiconductor memory device 3*b* of this Modification Example 2, insulating layers NOLm have a multi-layer configuration in which a plurality of insulating layers NL and a plurality of insulating layers NOL are alternately stacked one by one. Thereby, the oxygen ratio in the insulating layer NOLm can be adjusted more precisely, and the bowing shape in the lower part of the memory hole MHa can be controlled more precisely.

According to the manufacturing method of the semiconductor memory device 3*b* of this Modification Example 2, other effects similar to those of the manufacturing method of the semiconductor memory device 3 of Embodiment 3 are obtained.

Modification Example 3

Next, a semiconductor memory device 3*c* according to a Modification Example 3 of Embodiment 3 will be described with reference to FIG. 19. The semiconductor memory device 3*c* of the Modification Example 3 differs from Embodiment 3 in having an insulating layer NOLg in which a plurality of insulating layers NL and a plurality of insulating layers NOL are stacked at different intervals.

Figure 19:
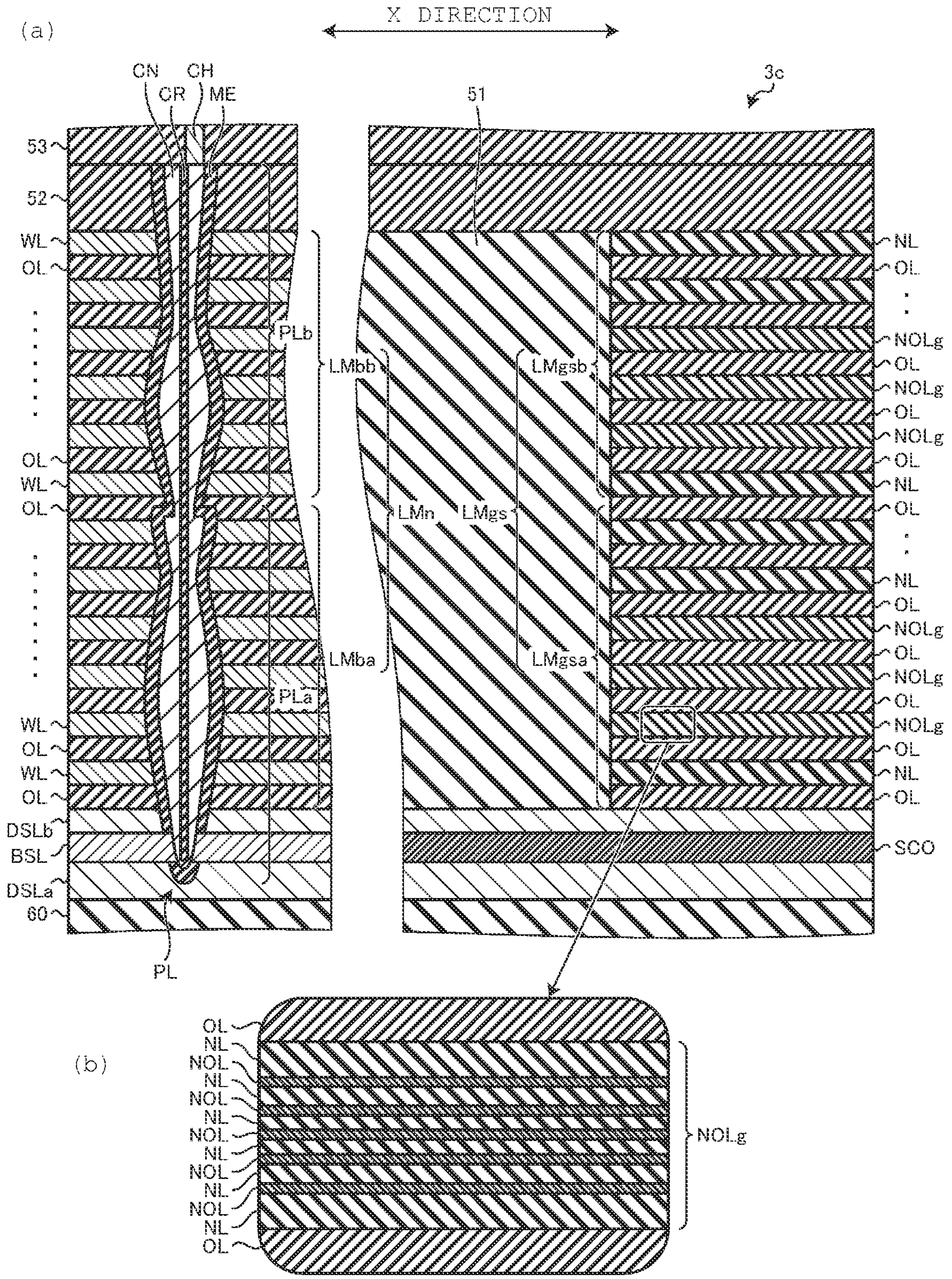
FIG. 19 is a cross-sectional view of a semiconductor memory device according to a Modification Example 3 of Embodiment 3.

FIG. 19 is a cross-sectional view showing an example of the configuration of the semiconductor memory device 3*c* according to this Modification Example 3 of Embodiment 3. Part (a) in FIG. 19 shows cross sections of the pillar PL disposed in the memory region MR and the unreplaced stacked body LMgs disposed in the outer peripheral region OR. Part (b) in FIG. 19 shows a partially enlarged view of the insulating layer NOLg provided in the stacked body LMgs.

As shown in FIG. 19, the semiconductor memory device 3*c* of this Modification Example 3 also includes a stacked body LMn in which all insulating layers OL have substantially the same thickness, as in Embodiment 3. The same applies to a stacked body LMgs disposed in the outer peripheral region OR and including a stacked body LMgsa disposed on the source line SL and a stacked body LMgsb disposed on the stacked body LMgsa.

However, the stacked body LMgsa includes insulating layers NOLg (each having a multi-layer configuration in which a plurality of insulating layers NL and a plurality of insulating layers NOL are alternately stacked one by one) instead of grouped insulating layers NL/NOL/NL of the stacked body LMdsa of Embodiment 3.

Similarly, the stacked body LMgsb includes several insulating layers NOLg (each having a multi-layer configuration in which a plurality of insulating layers NL and a plurality of insulating layers NOL are alternately stacked one by one) instead of grouped insulating layers NL/NOL/NL of the stacked body LMdsb of Embodiment 3.

Each of these insulating layers NOLg has therein a plurality of insulating layers NL having different layer thicknesses and the insulating layer NL becomes thinner toward the center in the stacking direction of the insulating layers NOLg. That is, the interval between the insulating layers NOL becomes narrower toward the center in the stacking direction of the insulating layers NOLg.

Here, the stacked body LMgs indicates the state before the stacked body LMn undergoes the replacement process. When the memory holes MHa and MHb are formed by low-temperature plasma etching, the memory holes MHa and MHb having a two-step bowing shape are obtained, even by configuring the stacked body LMn before the replacement process to include insulating layers NOLg.

That is, the pillar PLa disposed in the stacked body LMba has bowing shapes in the upper part and the lower part, respectively, and the bowing shape in the lower part is disposed at the height position of the insulating layer NOLg. Similarly, the pillar PLb disposed in the stacked body LMbb has bowing shapes in the upper part and the lower part, respectively, and the bowing shape in the lower part is disposed at the height position of the insulating layer NOLg.

According to the manufacturing method of the semiconductor memory device 3*c* of this Modification Example 3, insulating layers NOLg are formed such that the ratio of the insulating layers NOL among the plurality of insulating layers NL and the plurality of insulating layers NOL increases toward the central portion in the layer thickness direction of the insulating layers NOLg.

Thus, in the thickness direction of one insulating layer NOLg, by increasing the oxygen ratio of the insulating layer NOLg in the central portion where the deposits Dsh are more likely to be deposited, the amount of deposit Dsh can be reduced.

According to the manufacturing method of the semiconductor memory device 3*c* of this Modification Example 3, other effects similar to those of the manufacturing method of the semiconductor memory device 3 of Embodiment 3 are obtained.

OTHER EMBODIMENTS

Although the pillar PL is connected to the source line SL on the side surface of the channel layer CN in the Embodiments 1 to 3 and the Modification Examples, the present disclosure is not limited to these. For example, a pillar may be configured to be connected to the source line in the lower end of the channel layer by removing the memory layer on the bottom surface of the pillar.

Further, in Embodiments 1 to 3 and Modification Examples, the stacked bodies LM are stacked in two steps (stages) to form the stacked body LM with a two-tier structure including the stacked bodies LMa and LMb. However, the stacked body may have a one-tier structure, or may have a three-tier or higher structure. By increasing the number of tiers, the number of stacked word lines WL can be further increased.

When the stacked body has a one-tier structure, any configuration of Embodiments 1 to 3 and their Modification Examples can be applied to the lower layer side of the entire stacked body. Thus, a pillar can be formed that penetrates through the entire stacked body and has a two-step bowing shape on the upper layer side and the lower layer side.

When the stacked body has a multi-tier structure of three-tier or higher, any configuration in the Embodiments 1 to 3 and their Modification Examples can be applied to each stacked body configuring each tier. Thus, a pillar having a two-step bowing shape in the lower part and the upper part for each stacked body that configures each tier can be formed.

Further, in the Embodiments 1 to 3 and their Modification Examples, the structure including the stacked body LM and a peripheral circuit are formed on separate substrates, and these substrates are then bonded together. However, the semiconductor memory device is not limited to this, and the structure including the stacked body LM may be directly formed on the semiconductor substrate SB on which the peripheral circuit is formed.

In this case, the stacked body LM can be formed on the semiconductor substrate SB away from the region for the peripheral circuit. Alternatively, the stacked body LM may be formed on the insulating layer 40 shown in FIG. 11, and the structure including the stacked body LM may be disposed above the peripheral circuit. The methods in the Embodiments 1 to 3 and their Modification Examples are also applicable to semiconductor memory devices having these components.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device comprising:

a lower layer film;

a first stacked body above the lower layer film and having a plurality of first conductive layers and a plurality of first insulating layers alternately stacked on each other along a stacking direction; and a first pillar that penetrates through the first stacked body to reach the lower layer film and has a memory cell formed at each intersection with the plurality of first conductive layers, wherein at least one first insulating layer among the plurality of first insulating layers in a first region along the stacking direction of the first stacked body above a lowermost one of the first insulating layers of the first stacked body is thicker than the first insulating layers of the plurality of first insulating layers in a second region above the first region in the stacking direction of the first stacked body, and the first pillar has:

a first bowing shape at a height position along the stacking direction of the at least one first insulating layer, and a second bowing shape at a height position along the stacking direction in the second region, wherein, when a height of a top surface of the first stacked body from a bottom surface of the first stacked body is set to a value of 100%, the at least one first insulating layer in the first region is at a height position in a range of 20% to 50% of the height of the top surface from the bottom surface.

2. The semiconductor memory device according to claim 1, wherein multiple first insulating layers in the first region are each thicker than the first insulating layers in the second region.

3. The semiconductor memory device according to claim 2, wherein a thickest first insulating layer in the multiple first insulating layers in the first region is located at the maximum diameter of the first bowing shape.

4. The semiconductor memory device according to claim 1, wherein the first pillar tapers inwardly in diameter from the maximum diameter of the first bowing shape toward the lower layer film in the stacking direction.

5. The semiconductor memory device according to claim 1, wherein the second bowing shape has a maximum diameter at a top surface of the first stacked body.

6. The semiconductor memory device according to claim 1, further comprising:

a second stacked body above the first stacked body and having a plurality of second conductive layers and a plurality of second insulating layers alternately stacked on each other along the stacking direction; and a second pillar that penetrates through the second stacked body to reach a top surface of the first pillar in the first stacked body and has a memory cell formed at each intersection with the plurality of second conductive layers, wherein at least one second insulating layer among the plurality of second insulating layers in a third region along the stacking direction of the second stacked body above of the first stacked body is thicker than the second insulating layers of the plurality of second insulating layers in a fourth region above the third region in the stacking direction of the second stacked body, and the second pillar has:

a third bowing shape at a height position along the stacking direction of the at least one second insulating layer, and a fourth bowing shape at a height position along the stacking direction in the second region.

7. A manufacturing method for a semiconductor memory device, the method comprising:

forming a stacked body in which a plurality of first insulating layers and a plurality of second insulating layers are alternately stacked; and forming a memory pillar in a hole penetrating through the stacked body, wherein each of the plurality of first insulating layers is a layer in which a first element is nitrided, each of the plurality of second insulating layers is a layer in which the first element is oxidized, at least one first insulating layer among the plurality of first insulating layers in a first region in a stacking direction of the stacked body other than a lowermost first insulating layer of the stacked body comprises oxygen at a higher ratio than the first insulating layers in a second region above the first region, and the hole for the memory pillar is etched while a deposit including the first element and nitrogen is deposited on sidewalls of the hole, wherein, when a height of a top surface of the stacked body from a bottom surface of the stacked body is set to a value of 100%, the at least one first insulating layer in the first region is at a height position in a range of 20% to 50% of the height of the top surface from the bottom surface.

8. The manufacturing method according to claim 7, wherein the at least one first insulating layer has a composition with 30 atm % to 45 atm % of the first element, 35 atm % to 55 atm % of nitrogen, and 10 atm % to 20 atm % of oxygen.

9. The manufacturing method according to claim 7, wherein the at least one first insulating layer is an oxynitride layer.

10. The manufacturing method according to claim 7, wherein the at least one first insulating layer is a stacked structure of nitride layers and at least one oxynitride layer.

11. The manufacturing method according to claim 10, wherein the stacked structure includes a plurality of oxynitride layers.

12. A semiconductor memory device comprising:

a lower layer film;

a first stacked body above the lower layer film and having a plurality of first conductive layers and a plurality of first insulating layers alternately stacked on each other along a stacking direction; and a first pillar that penetrates through the first stacked body to reach the lower layer film and has a memory cell formed at each intersection with the plurality of first conductive layers, wherein at least one first insulating layer among the plurality of first insulating layers in a first region along the stacking direction of the first stacked body above a lowermost one of the first insulating layers of the first stacked body is thicker than the first insulating layers of the plurality of first insulating layers in a second region above the first region in the stacking direction of the first stacked body, and the first pillar has:

a first bowing shape at a height position along the stacking direction of the at least one first insulating layer, and a second bowing shape at a height position along the stacking direction in the second region, and multiple first insulating layers in the first region are each thicker than the first insulating layers in the second region.

13. The semiconductor memory device according to claim 12, wherein a thickest first insulating layer in the multiple first insulating layers in the first region is located at the maximum diameter of the first bowing shape.

14. The semiconductor memory device according to claim 12, further comprising:

a second stacked body above the first stacked body and having a plurality of second conductive layers and a plurality of second insulating layers alternately stacked on each other along the stacking direction; and a second pillar that penetrates through the second stacked body to reach a top surface of the first pillar in the first stacked body and has a memory cell formed at each intersection with the plurality of second conductive layers, wherein at least one second insulating layer among the plurality of second insulating layers in a third region along the stacking direction of the second stacked body above of the first stacked body is thicker than the second insulating layers of the plurality of second insulating layers in a fourth region above the third region in the stacking direction of the second stacked body, and the second pillar has:

a third bowing shape at a height position along the stacking direction of the at least one second insulating layer, and a fourth bowing shape at a height position along the stacking direction in the second region.

15. The semiconductor memory device according to claim 12, wherein, when a height of a top surface of the first stacked body from a bottom surface of the first stacked body is set to a value of 100%, the at least one first insulating layer in the first region is at a height position in a range of 20% to 50% of the height of the top surface from the bottom surface.

* * * * *